United States Patent
Lee et al.

(10) Patent No.: US 9,506,978 B2
(45) Date of Patent: *Nov. 29, 2016

(54) APPARATUS FOR PROBING DIE ELECTRICITY AND METHOD FOR FORMING THE SAME

(71) Applicant: MPI CORPORATION, Chu-Pei, Hsinchu Shien (TW)

(72) Inventors: Chung-Tse Lee, Chu-Pei (TW); Chien-Chou Wu, Chu-Pei (TW); Yi-Ming Chan, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/847,957

(22) Filed: Sep. 8, 2015

(65) Prior Publication Data

US 2015/0377957 A1    Dec. 31, 2015

Related U.S. Application Data

(63) Continuation of application No. 13/706,526, filed on Dec. 6, 2012, now Pat. No. 9,157,929.

(60) Provisional application No. 61/568,643, filed on Dec. 8, 2011.

(30) Foreign Application Priority Data

Sep. 7, 2012   (TW) .............................. 101132773 A

(51) Int. Cl.
*G01R 31/28* (2006.01)
*G01R 1/04* (2006.01)

(52) U.S. Cl.
CPC ......... *G01R 31/2889* (2013.01); *G01R 1/0408* (2013.01); *G01R 1/0416* (2013.01)

(58) Field of Classification Search
CPC .......... G01R 31/2889; G01R 1/07378; G01R 1/07371; G01R 3/00; G01R 31/2891; G01R 1/44; G01R 1/0491; G01R 31/2886; G01R 1/0458; G01R 31/2863; G01R 31/2874; G01R 12/7082; G01R 12/714; G01R 1/04; G01R 1/0408
See application file for complete search history.

(56) References Cited

U.S. PATENT DOCUMENTS

| | | |
|---|---|---|
| 5,811,982 A | 9/1998 | Beaman et al. |
| 7,014,499 B2 | 3/2006 | Yoon |
| 7,582,399 B1 * | 9/2009 | Mishra .................. G03G 5/047 430/57.1 |

(Continued)

FOREIGN PATENT DOCUMENTS

| | | |
|---|---|---|
| CN | 1135268 | 11/1996 |
| CN | 1797732 | 7/2006 |

(Continued)

*Primary Examiner* — Vinh Nguyen
(74) *Attorney, Agent, or Firm* — Muncy, Geissler, Old & Lowe, P.C.

(57) ABSTRACT

An apparatus for probing die electricity includes a substrate, a converting plate, a needle module and a reinforcement structure. The converting plate includes two opposite surfaces respectively having a plurality of first and second conductive elements. The needle module has a plurality of needles respectively and electrically connected to the plurality second conductive elements. The reinforcement structure is made from a polymer gel and disposed between the converting plate and the substrate.

17 Claims, 28 Drawing Sheets

(56) References Cited

U.S. PATENT DOCUMENTS

| | | | |
|---|---|---|---|
| 8,159,247 B2 | 4/2012 | Gluschenkov et al. | |
| 9,157,929 B2 * | 10/2015 | Lee | G01R 1/0408 |
| 2005/0040525 A1 | 2/2005 | Chien | |
| 2008/0018350 A1 | 1/2008 | Chao et al. | |
| 2010/0301884 A1 | 12/2010 | Takane et al. | |
| 2012/0212247 A1 * | 8/2012 | Sakata | G01R 31/2889 |
| | | | 324/754.03 |

FOREIGN PATENT DOCUMENTS

| | | |
|---|---|---|
| CN | 101105506 | 1/2008 |
| CN | 101135701 | 3/2008 |
| CN | 101374382 | 2/2009 |
| CN | 101385137 | 3/2009 |
| CN | 201302583 | 9/2009 |
| CN | 101556945 | 10/2009 |
| CN | 101625375 | 1/2010 |
| CN | 101644724 | 2/2010 |
| CN | 101930016 | 12/2010 |
| CN | 102217092 | 10/2011 |
| TW | 239600 | 12/1981 |
| TW | 558062 | 1/2003 |
| TW | 569356 | 1/2004 |
| TW | 1260416 | 8/2006 |
| TW | 1313355 | 8/2009 |
| TW | M392351 | 11/2010 |
| TW | 201121015 A | 6/2011 |
| TW | 201213810 | 4/2012 |
| TW | 201224462 | 6/2012 |

* cited by examiner

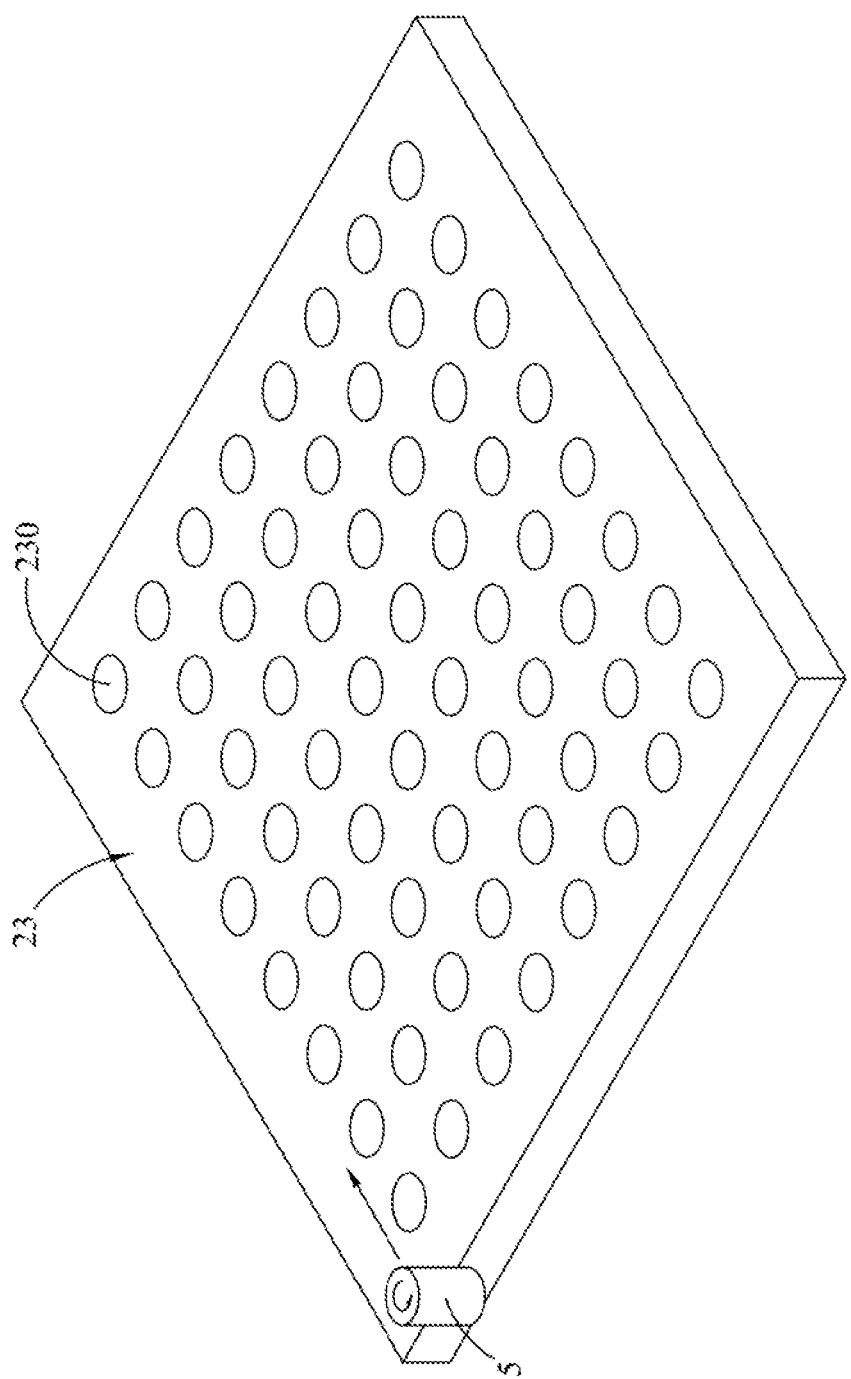

APPARATUS FOR PROBING DIE ELECTRICITY AND METHOD FOR FORMING THE SAME

CROSS-REFERENCE TO RELATED APPLICATION

This application is a continuation application of U.S. patent application Ser. No. 13/706,526 filed on Dec. 6, 2012, now U.S. Pat. No. 9,157,929.

FIELD OF THE INVENTION

The present invention relates to a chip inspection device, and more particularly, to an apparatus with enforcement structure for probing die electricity and method for forming the same.

BACKGROUND OF THE INVENTION

Forming a plurality of integrated circuit chips in a semiconductor wafer generally involves a plurality of processing steps. Because of the complex manufacturing process, defects are inevitably found on some chips. Therefore, before the steps of wafer dicing and separation of the integrated circuit chips from the semiconductor wafer, it is necessary to test the integrated circuit chips to determine whether the integrated circuit chips are defective or not.

Generally speaking, to test an integrated circuit (IC) chip, the IC chip is engaged and probed by a probe needle assembly, where electric signals relating to the electric properties of the IC chip is transmitted to a test device for analysis so as to determine whether the integrated circuit chip is defective or not. Conventionally, the probe needle assembly is composed of a plurality probe needles that are arranged in an array for allowing the plural probe needles to engage respectively to their corresponding electric pads of the IC chip and thus enabling testing signals from the test device to be transmitted precisely to the IC chip.

Please refer to FIG. 1, which is a schematic diagram showing a conventional electrical property test device. As shown in FIG. 1, the electrical property test device 1 includes a circuit board 10, a converting plate 11, and a probe assembly 12. The circuit board 10 has a plurality of first conductors 100 disposed thereon for allowing the plural first conductors to connect electrically to a plurality of second conductors 110 that are disposed on a top surface of the converting plate 11. In addition, there are a plurality of third conductors 111 disposed on a bottom surface of the converting plate 11 at positions connected electrically and respectively to a plurality of probe needles 120 of the probe assembly 12. Thereby, through the electrical connection between the probe needles 120 of the probe assembly 12 and the electric pads 131 formed in a IC chip 130 of a wafer 13, electrical signals relating to the electrical properties of the IC chip 130 can be transmitted to the circuit board 10 through the converting plate 11, whereas the signals are further being transmitted through the conductive lines 101 formed on the circuit board 10 to an analyzing unit for subsequent analysis.

In the current market, the converting plate 11 is generally manufactured and assembled by a semiconductor package process, and due to cost considerations, there is a growing trend of providing thinner converting plate 11. Moreover, when the electrical property test device 1 is used for conducting a probing test, the probes 120 of the probe assembly 12 should be engaged with the electric pads 131 of the device under test 130 (herein referred to as the DUT thereafter), so that it is required to have a great amount probes 120 to be arranged and distributed within an area capable of enclosing the electric pads 131 of the DUT 130. Nevertheless, at the time when the probes 120 are enabled to engage electrically to the converting plate 11, the DUT 130 will exert a reaction force to the probes 120, so as to make the probes 120 apply the force on the converting plate 11. Consequently, since the converting plate is a thin plate and all the probes 12 are distributed in a small area on the convening plate 11 that is conforming to the distribution of the electric pads 131 of the DUT 130, the converting plate can easily be deformed or even cracked by the force, causing a severe adverse affect upon the subsequent analysis.

SUMMARY OF THE INVENTION

The present invention provides an apparatus for probing die electricity, in which a reinforcement structure is arranged sandwiching between a circuit board and a converting plate so as to support the converting plate to resist a reaction force from the engaging of probes upon a DUT during a probing test, and thus prevent the converting plate from deforming or even cracking by pressure.

In an embodiment, the present invention provides an apparatus for probing die electricity, which comprises: a substrate; a converting plate, having a first surface and a second surface that are arranged opposite to each other and respectively have a plurality of first and second conductive elements disposed thereon; a needle module, configured with a plurality of needles; and a reinforcement structure, disposed at a position between the converting plate and the substrate; wherein, the plural first conductive elements are arranged coupling respectively to the substrate, and the plural second conductive elements are respectively and electrically connected to the plural needles of the needle module.

In an embodiment, the present invention provides a method for forming an apparatus for probing die electricity, which comprises the steps of: providing a substrate; providing a converting plate having a first surface and a second surface that are arranged opposite to each other and respectively have a plurality of first and second conductive elements disposed thereon while allowing the plural first conductive elements to be distributed in an area larger than that of the plural second conductive elements; determining a reinforcement structure according to the thickness of the converting plate and the distribution of the first conductive elements; enabling the reinforcement structure to be formed at a position between the first surface and the substrate while allowing the reinforcement structure to be disposed corresponding to at least one the plural second conductive elements; and proceeding a reflow soldering process for enabling the plural first conductive elements to couple respectively to the substrate.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein:

FIG. 14 is a schematic diagram showing a plurality of exhaust passages formed in the apparatus of the invention.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
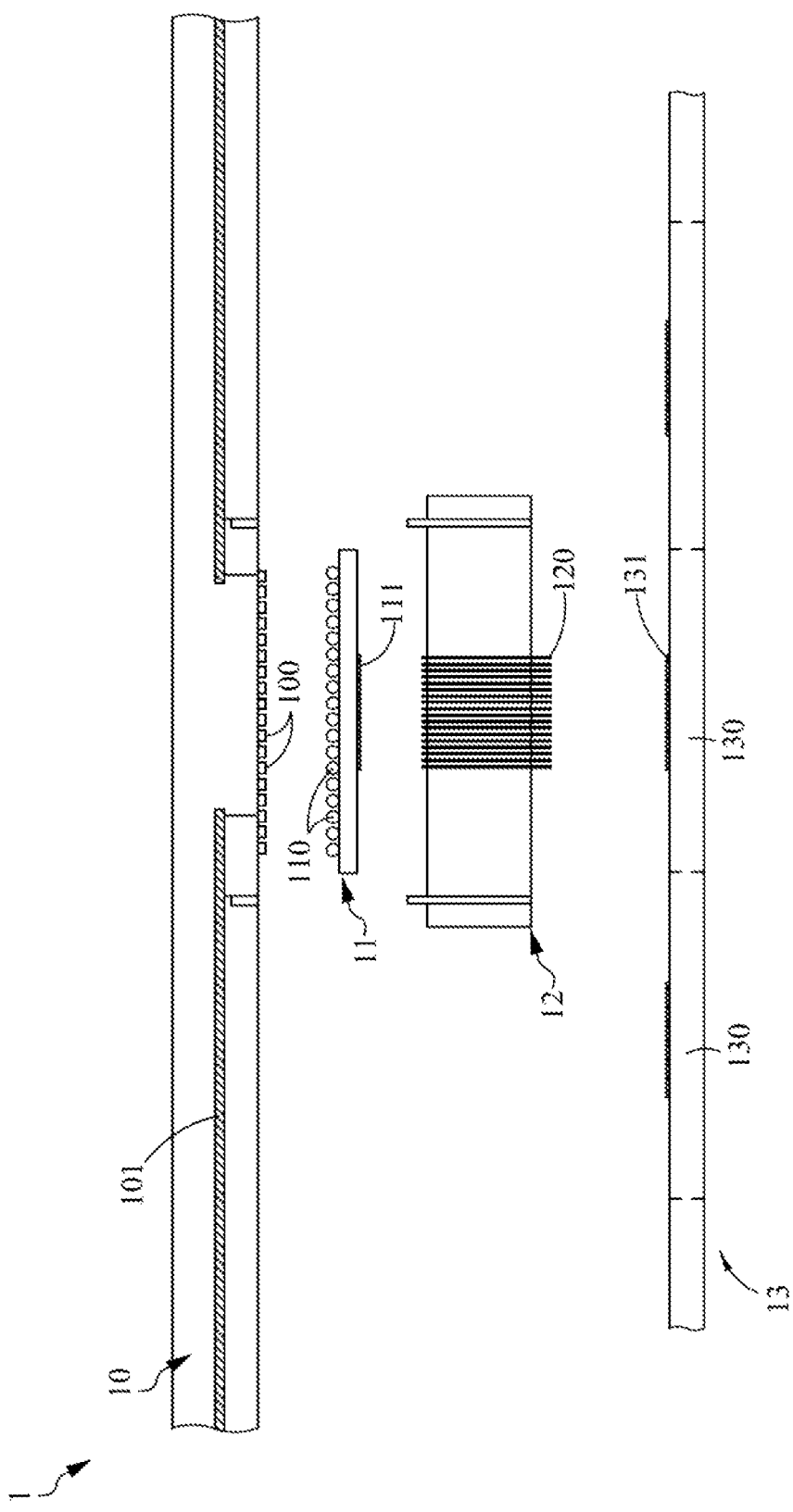
FIG. 1 is a schematic diagram showing a conventional electrical property test device.
Figure 2A:
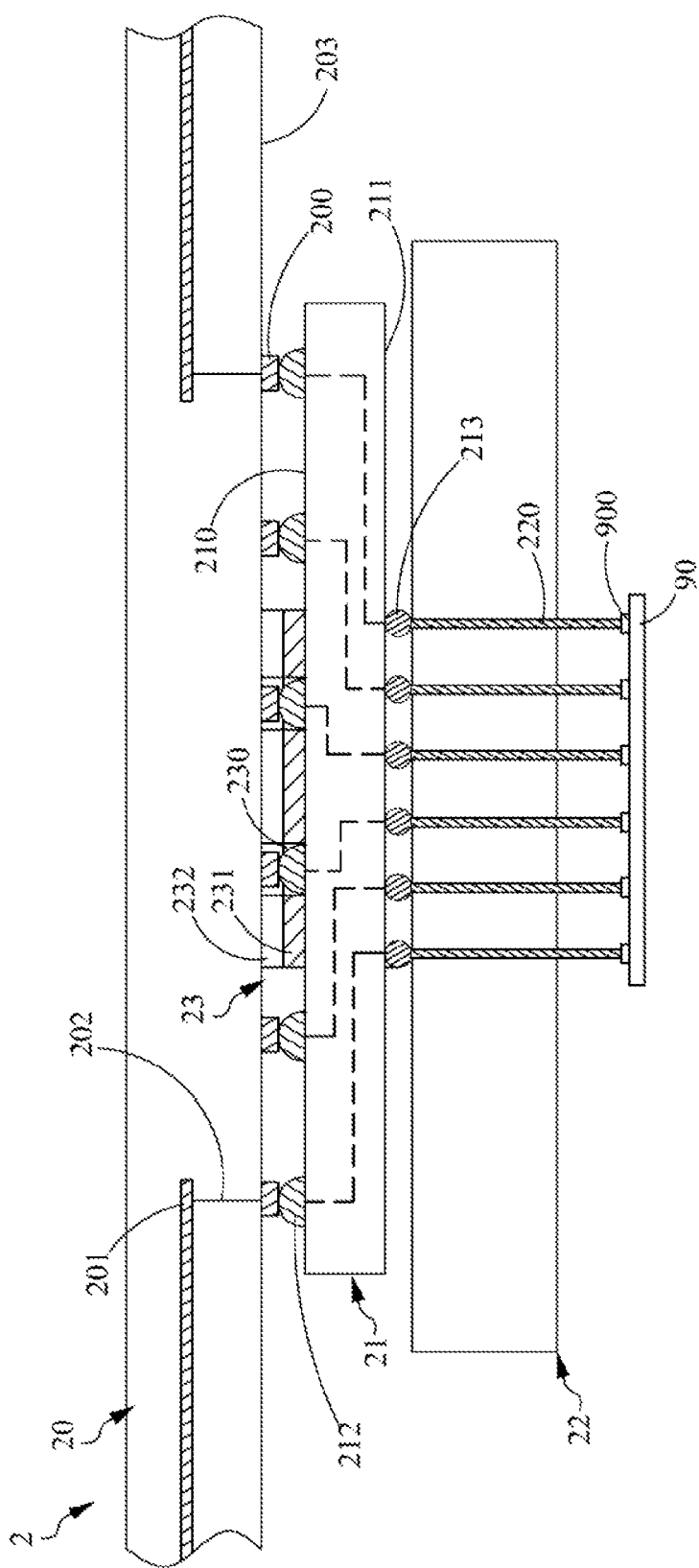
FIG. 2A is a schematic diagram showing an apparatus for probing die electricity according to a first embodiment of the invention.

Please refer to FIG. 2A, which is a schematic diagram showing an apparatus for probing die electricity according to a first embodiment of the invention. In this first embodiment, the apparatus for probing die electricity 2 comprises: a substrate 20, a converting plate 21, a needle module 22 and a reinforcement structure 23. The substrate 20 in this embodiment is substantially a circuit board and has a plurality of third conductive elements 200 disposed on a surface thereof so as to be used as signal transmission interfaces between the apparatus for probing die electricity 2 and a test device. In addition, the substrate 20 is configured with a plurality of conductive lines 201, and in this embodiment, the conductive lines 201 are formed inside the substrate 20 and are respectively and electrically connected to the plural third conductive elements 200 by certain conducting units 202, such as conducting wires or conductive via holes. It is noted that those conductive lines 201 are not necessary to be formed inside the substrate 20, but instead they can be formed and disposed on a surface of the substrate 20 so as to engage directly to the plural third conductive elements 200.

The converting plate 21 is formed with a first surface 210 and a second surface 211 that are arranged opposite to each other. There are a plurality of first conductive elements 212 disposed on the first surface that are respectively and electrically connected to the plural third conductive elements 200, and also there are a plurality of second conductive elements 213 disposed on the second surface 211 that are respectively and electrically connected to the plural first conductive elements 212. It is noted that the converting plate 21 can be a multi-layered organic (MLO) structure, but is not limited thereby. Moreover, the converting plate 21 is used as an electric connection interface between two groups of electric pads that are distributed within different areas. For instance, the distribution of the plural first conductive elements 212 on the first surface 210 is different from the distribution of the plural second conductive elements 213 on the second surface 211 in density, range and position. In this embodiment, the plural second conductive elements 213 are distributed in an area smaller than that of the plural first conductive elements 212, and the pitch between any two neighboring second conductive elements 213 is smaller than the pitch between any two neighboring first conductive elements 212. It is noted that each of the plural first, second and third conductive elements 212, 213, and 200 can be a bump, a ball or a pad made of tin solder. In addition, the thickness of the converting plate 21 is determined and manufactured according at actual requirement, and in this embodiment, it is made in a thickness thinner than or equal to 1 mm. The needle module 22 has a plurality of needles 220 that are perpendicularly arranged and are respectively and electrically connected to the plural second conductive elements 213 of the converting plate 21, whereas the free ends of the needles 220 in the needle module 22 can be provided for connecting electrically to the electric pads 900 of an IC chip to be tested 90 when the needle module 22 is used in a die electricity test.

As shown in FIG. 2A, the reinforcement structure 23 is arranged sandwiching between the converting plate 21 and the substrate 20, and in this embodiment, the top of the reinforcement structure 23 is arrange abutting to the bottom surface 203 of the substrate 20 while the bottom of the reinforcement structure 23 is arranged engaging to the first surface 210 of the converting plate 21. Please refer to FIG. 3, which is a schematic diagram showing a reinforcement structure according to an embodiment of the present invention. In the embodiment shown in FIG. 3, the reinforcement structure 23 is configured with a panel 231 and a plurality of via holes 230 that are formed boring through the panel 231, whereas each of the plural via holes 230 is provided for one of the plural first conductive elements 212 to fit therein. In one embodiment, the panel 231 is arranged at a position corresponding to at least one of the plural second conductive elements 213 for enabling the panel 231 to receive and withstand reaction force from the needle 220 that is connected to the corresponding second conductive element 213, and moreover, each via hole 230 should be formed in a aperture width larger than the width of the first conductive element 212 that is to be fitted therein while allowing a gap to be maintained between the inner wall of the via hole 230 and its corresponding first conductive element 212. In another word, the cross section area of each via hole 230 is larger than that of each first conductive element 212.

In addition, in another embodiment, there are a plurality of projections 232 formed on the panel 231 that are arranged allowing the plural projections 232 to abut against the surface 203 of the substrate 20 so as to construct a plurality of exhaust passages accordingly to be used for exhausting waste gases resulting from a reflow soldering process for connecting the substrate 20 to the converting plate 21. In the embodiment shown in FIG. 3, by the arrangement of the plural projections 232, there are at least one first exhaust passage 233a and at least one second exhaust passage 233b to be formed in a manner that the first exhaust passage 233a and the second exhaust passage 233b are arranged intersecting with each other in any angle not restricted to be 90 degrees. In an embodiment, the height of each of the exhaust passages 233a and 233b is smaller than or equal to half of the thickness D of the panel 231.

It is noted that in this embodiment the plural projections 232 are formed on the panel 231 of the reinforcement structure 23 within an area corresponding to and the substrate 20. In addition, the reinforcement structure 23 can be formed in an area smaller than or equal to the area enclosed within the outer circumference of the plural second conductive elements 231. However, if an exhaust passage design with improved gas exhausting efficiency can be achieved, it is acceptable for allowing the reinforcement structure 23 to be formed in an area larger than the area enclosed within the outer circumference of the plural second conductive elements 231. Moreover, the thickness of the reinforcement structure is determined according to actual requirement based upon the thickness of the converting plate and the magnitude of force that is designed for the reinforcement structure to receive and withstand.

Figure 2B:
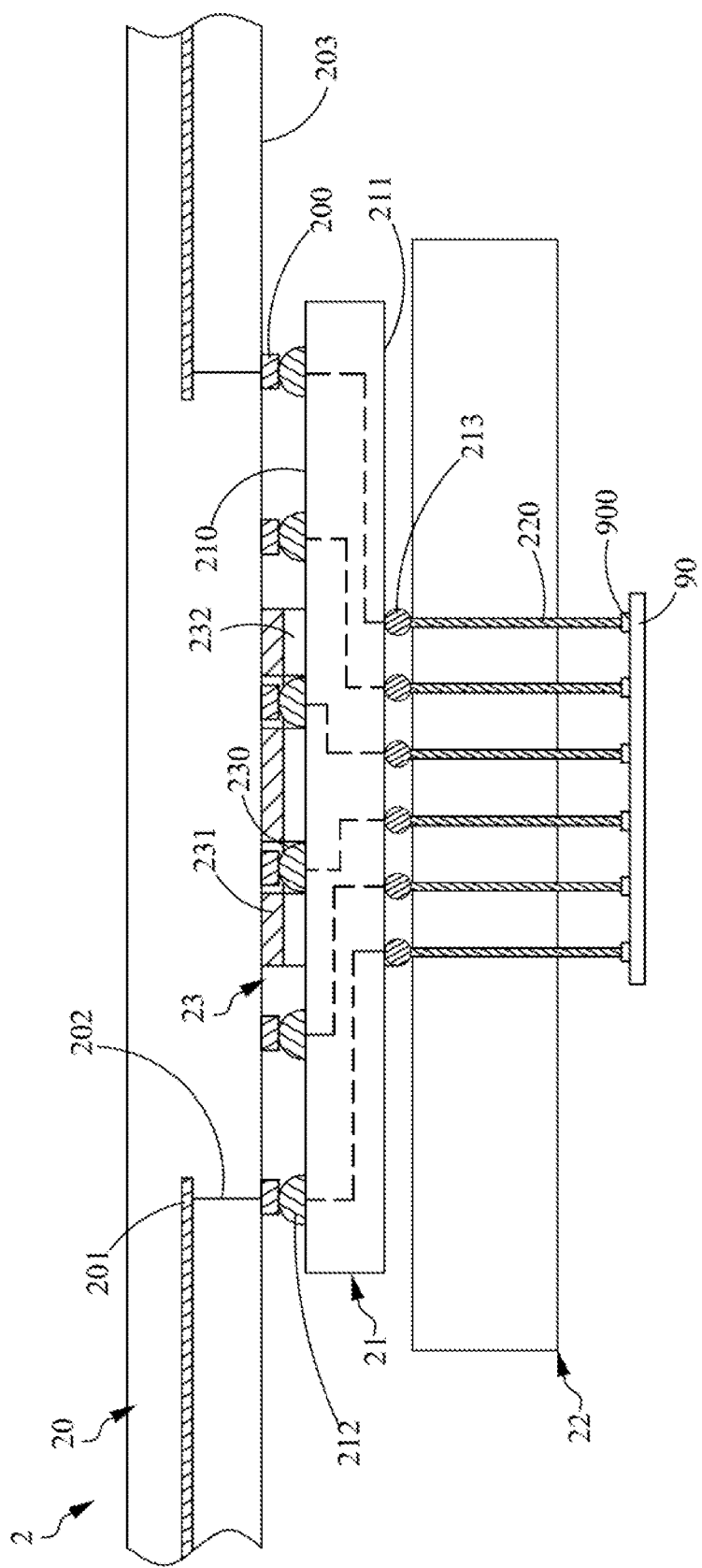
FIG. 2B is a schematic diagram showing an apparatus for probing die electricity according to a second embodiment of the invention.
Figure 3:
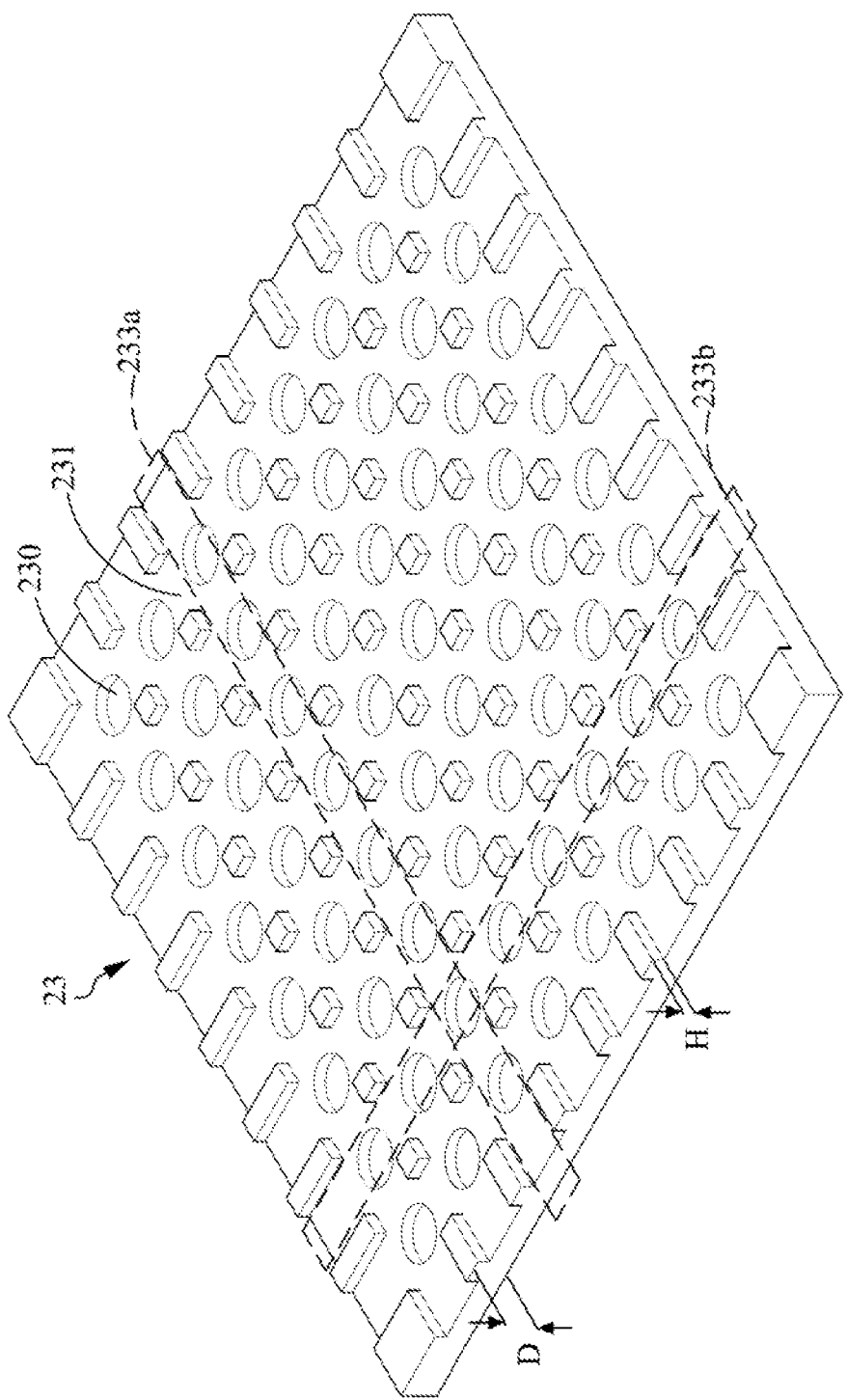
FIG. 3 is a schematic diagram showing a reinforcement structure according to an embodiment of the present invention.
Figure 4A:
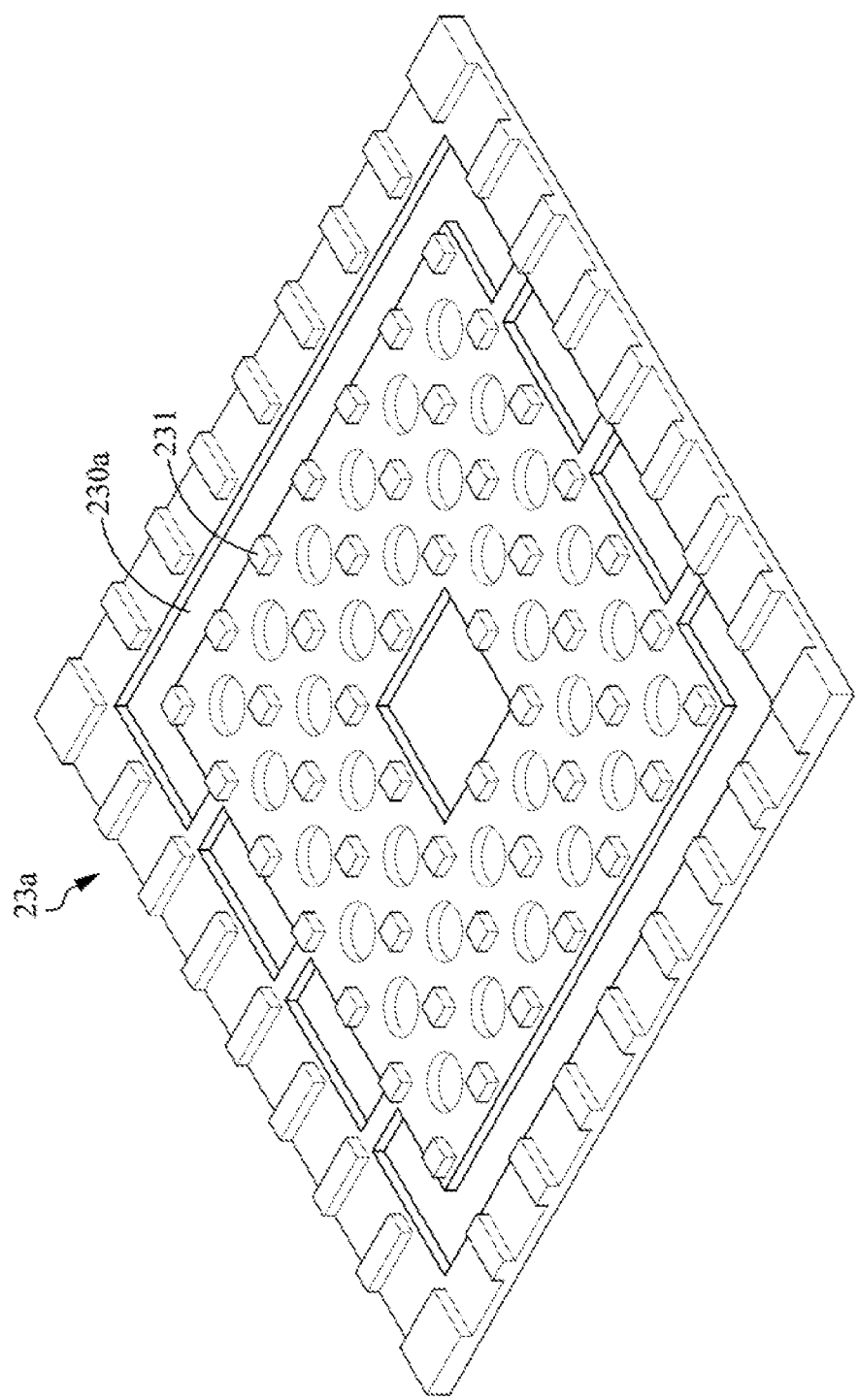
FIG. 4A to FIG. 4C are schematic diagrams showing various reinforcement structures according to other embodiments of the present invention
Figure 4B:
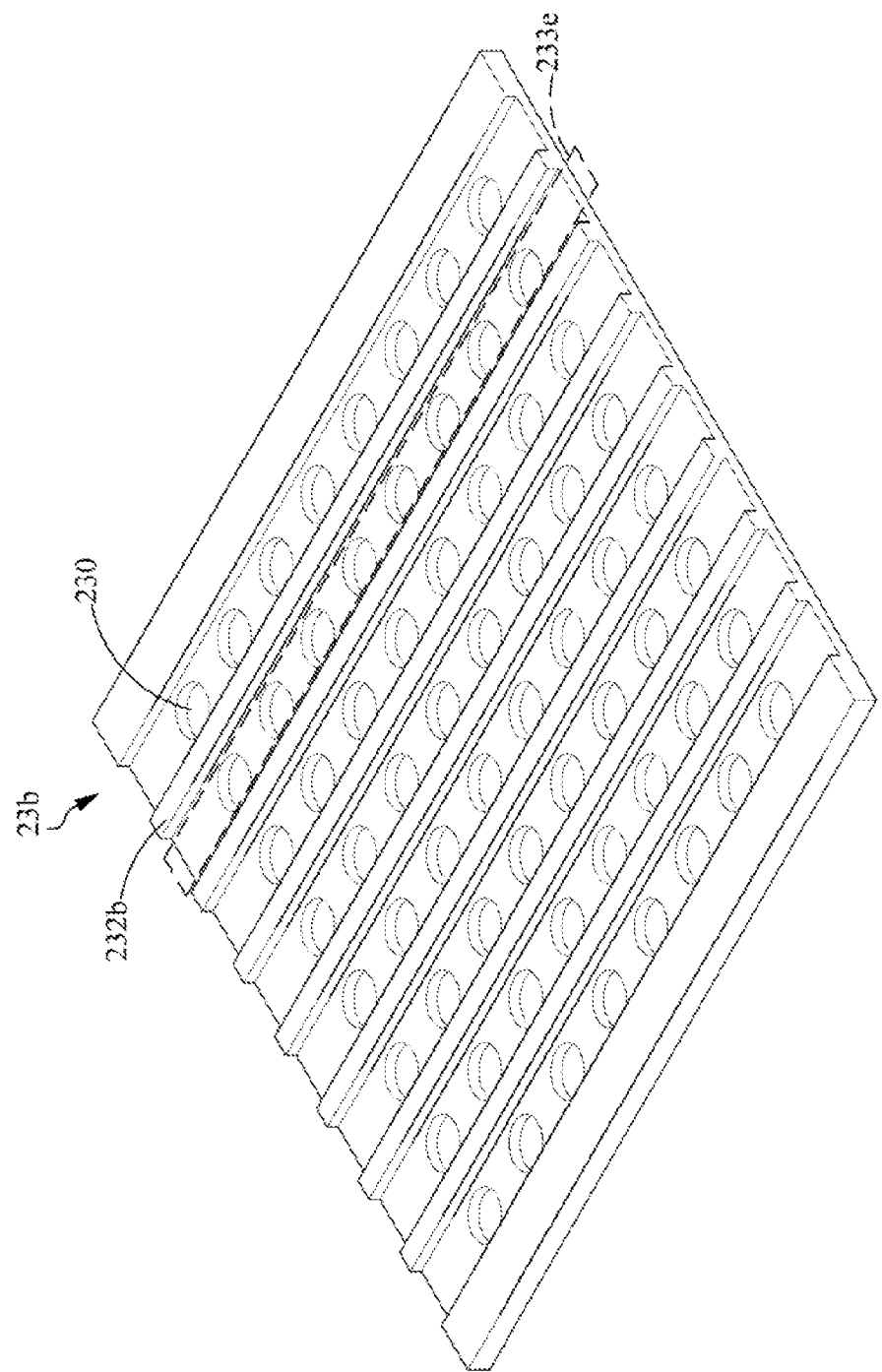
Figure 4C:
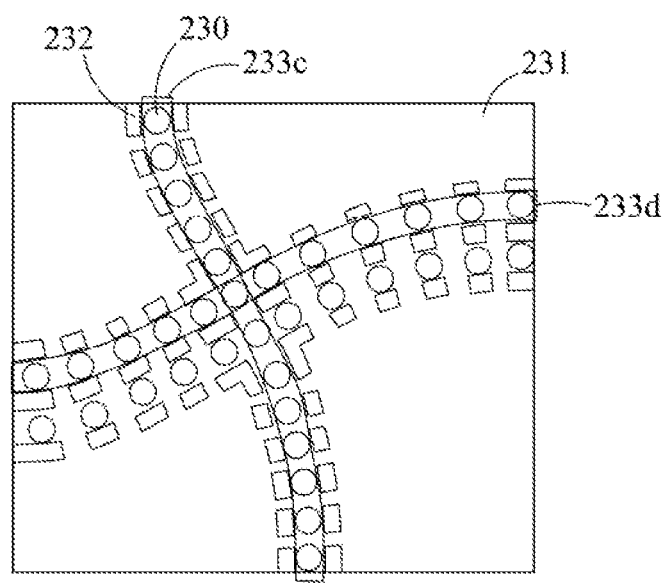

Notably that each via hole 230 is not restricted to be a circular hole, as those shown in FIG. 3, and also it is not only used for receiving only one first conductive element 212. Please refer to FIG. 4A, which is a schematic diagram showing a reinforcement structures according to another embodiment of the present invention. In the embodiment shown in FIG. 4A, the reinforcement structure 23a is formed with a plurality of non-circular via holes 230a that each of the via holes 230a is provided for receiving more than one of the plural first conductive elements 212. In addition, the projections 232 to be used for constructing the exhaust passages are not limited to be button-like objects arranged in a two-dimensional array, as shown in FIG. 3, and instead, as shown in FIG. 4B, each of the projections 232b can be a straight projected bar, and consequently, each exhaust passage 233e is substantially a groove formed between two neighboring straight projected bars 232b. Moreover, the shape of each exhaust passage is formed and determined according to the arrangement of the via holes. For instance, each exhaust passage in the embodiments shown in FIG. 4A and FIG. 4B is a straight line, but in another embodiment shown in FIG. 4C, the exhaust passages 233c and 233d are serpentine lines as the via holes are distributed irregularly and the projections for constructing the exhaust passages 233c and 233d have to be arranged following the peripheries of those via holes 230. Similarly, the exhaust passages 233c and 233d are arranged intersecting with each other in any angle not restricted to be 90 degrees. Please refer to FIG. 2B, which is a schematic diagram showing an apparatus for probing die electricity according to a second embodiment of the invention. In this second embodiment, the probing apparatus 2 is constructed basically the same as the one shown in FIG. 2A, but is different in that: the projections 232 are formed on the panel 231 of the reinforcement structure 23 within an area thereof corresponding to the converting plate 21 for allowing the plural projections 232 to abut against the first surface 210 of the converting plate 21.

Figure 5A:
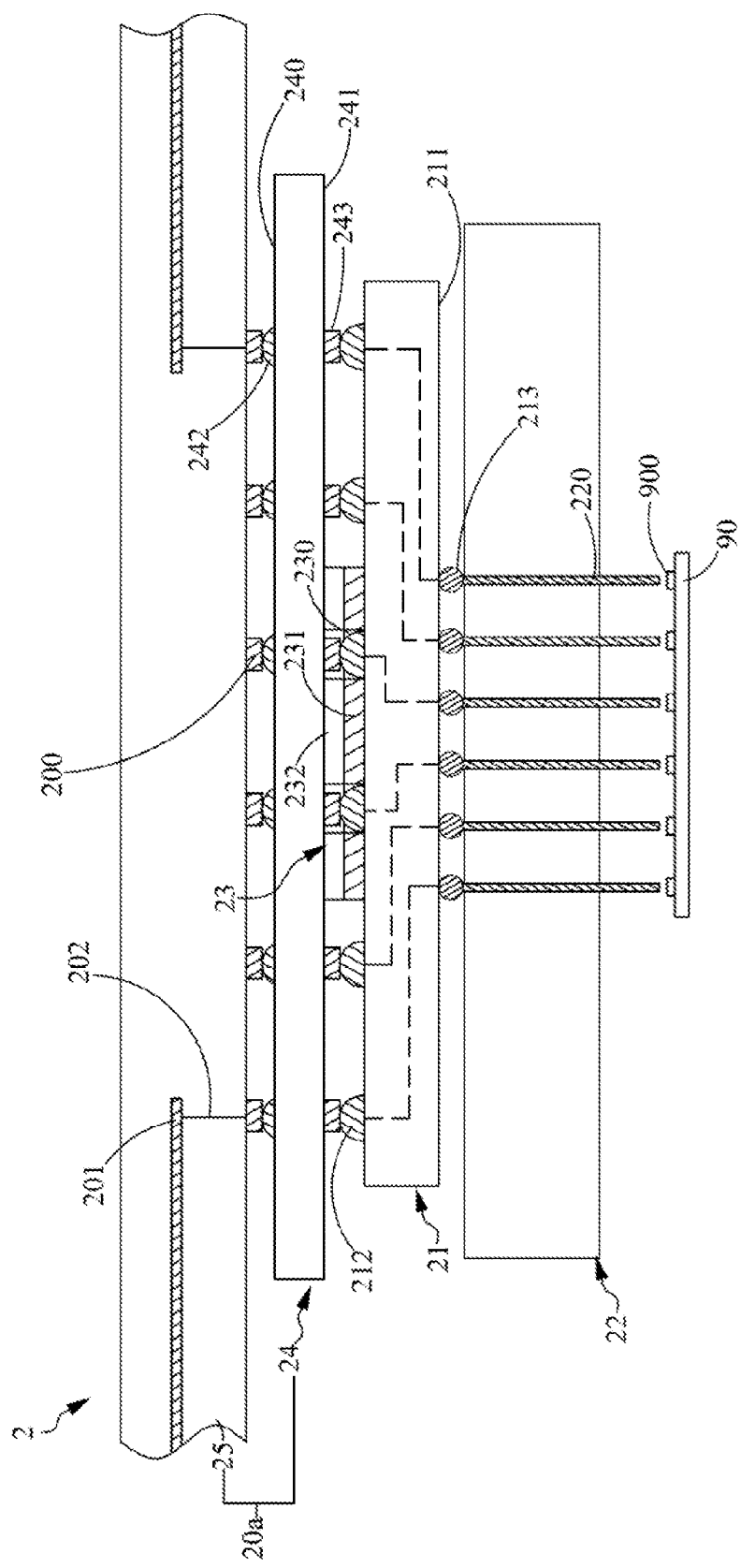
FIG. 5A is a schematic diagram showing an apparatus for probing die electricity according to a third embodiment of the invention.

Please refer to FIG. 5A, which is a schematic diagram showing an apparatus for probing die electricity according to a third embodiment of the invention. In the third embodiment, the probing apparatus 2 is constructed basically the same as the one shown in FIG. 2A, but is different in that: the substrate 20a is composed of a circuit board 25 and a strengthening plate 24, whereas the strengthening plate 24 is arranged between the circuit board 25 and the reinforcement structure 23 and is substantially a multi-layered ceramic (MLC) structure. In addition, the strengthening plate 24 has two opposite surfaces 240 and 241 that are provided for a plural fourth conductive elements 242 and a plural fifth conductive elements 243 to be formed therein in respective, while allowing the plural fourth conductive elements 242 to connect electrically and respectively to the plural third conductive elements 100, and the plural fifth conductive elements 243 to connect electrically and respectively to the plural first conductive elements 212. Similarly, each of the fourth and fifth conductive elements 242 and 243 can be a bump, a ball or a pad that is made of tin solder. Moreover, in this embodiment, the projections 232 of the reinforcement structure 23 are arranged abutting to the surface 241 of the strengthening plate 24 where the fifth conductive elements 243 are disposed. Since the strengthening plate 24 is formed with a mechanical strength larger than that of the converting plate 21, the strengthening plate 24 can not be deformed as easily as the converting plate 23. Thus, by the double reinforcement of the reinforcement structure 23 and the strengthening plate 24, the deformation of the converting plate 21 by the pressure from the needle module 22 is reduced as the structural integrity of the converting plate 21 is strengthened. Please refer to FIG. 5B, which is a schematic diagram showing an apparatus for probing die electricity according to a fourth embodiment of the invention. In the third embodiment, the probing apparatus 2 is constructed basically the same as the one shown in FIG. 5A, but is different in that: the projections 232 of the reinforcement structure 23 are arranged abutting to the surface 210 of the converting plate 21 where the first conductive elements 212 are disposed.

Figure 5B:
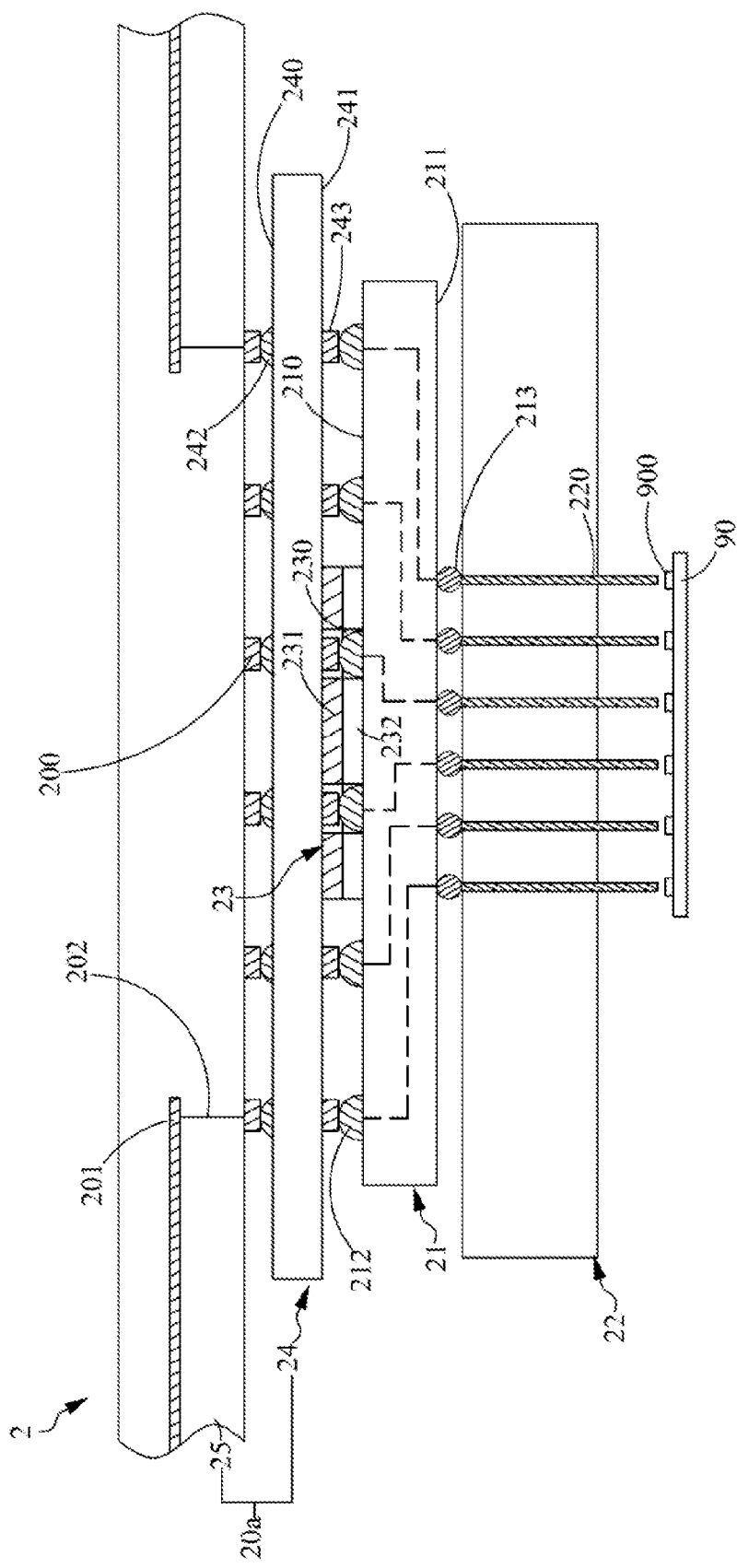
FIG. 5B is a schematic diagram showing an apparatus for probing die electricity according to a fourth embodiment of the invention.
Figure 6A:
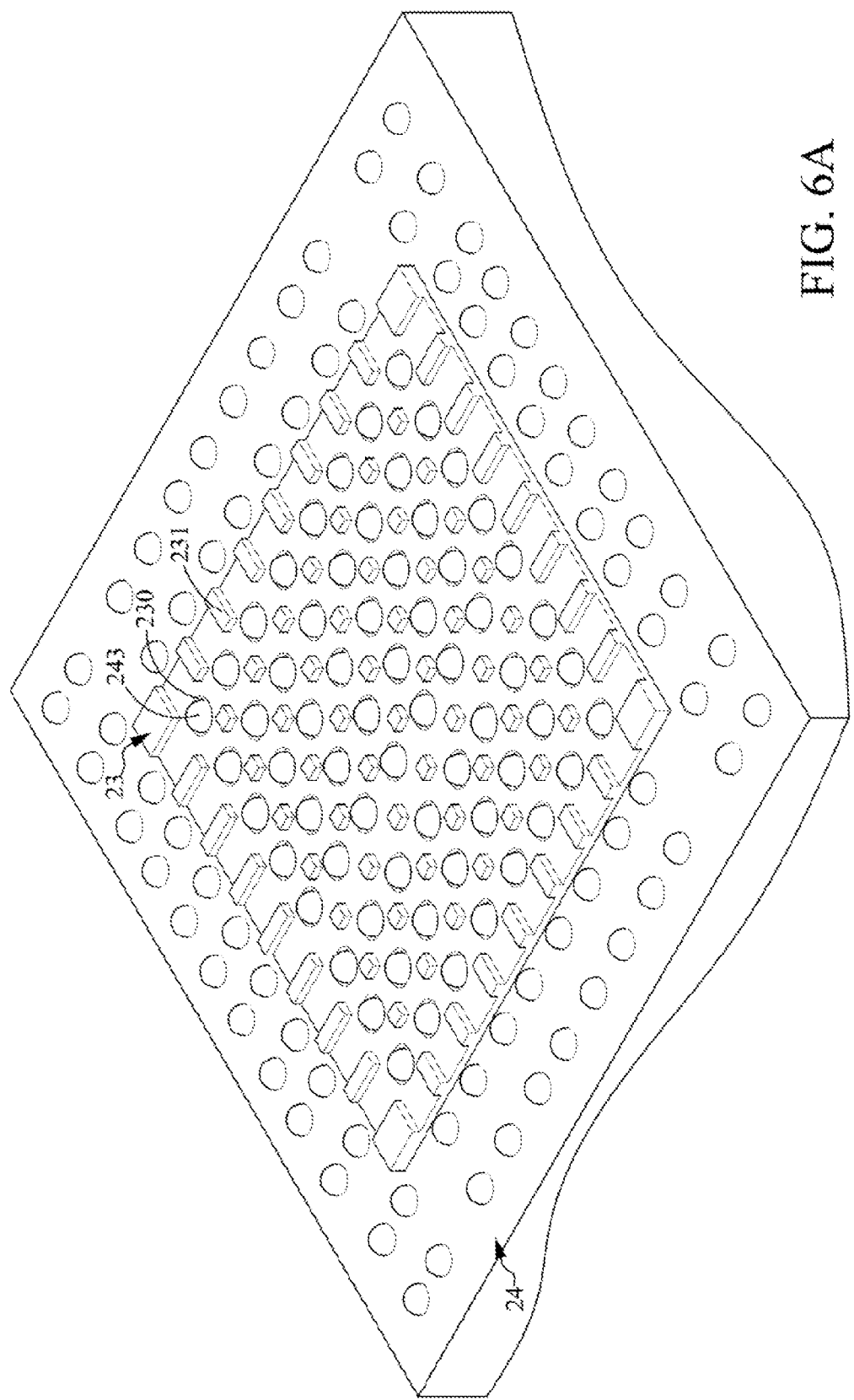
FIG. 6A to FIG. 6D are schematic diagrams showing various manners for assembling a strengthening plate with a reinforcement structure according to different embodiments of the invention.
Figure 6B:
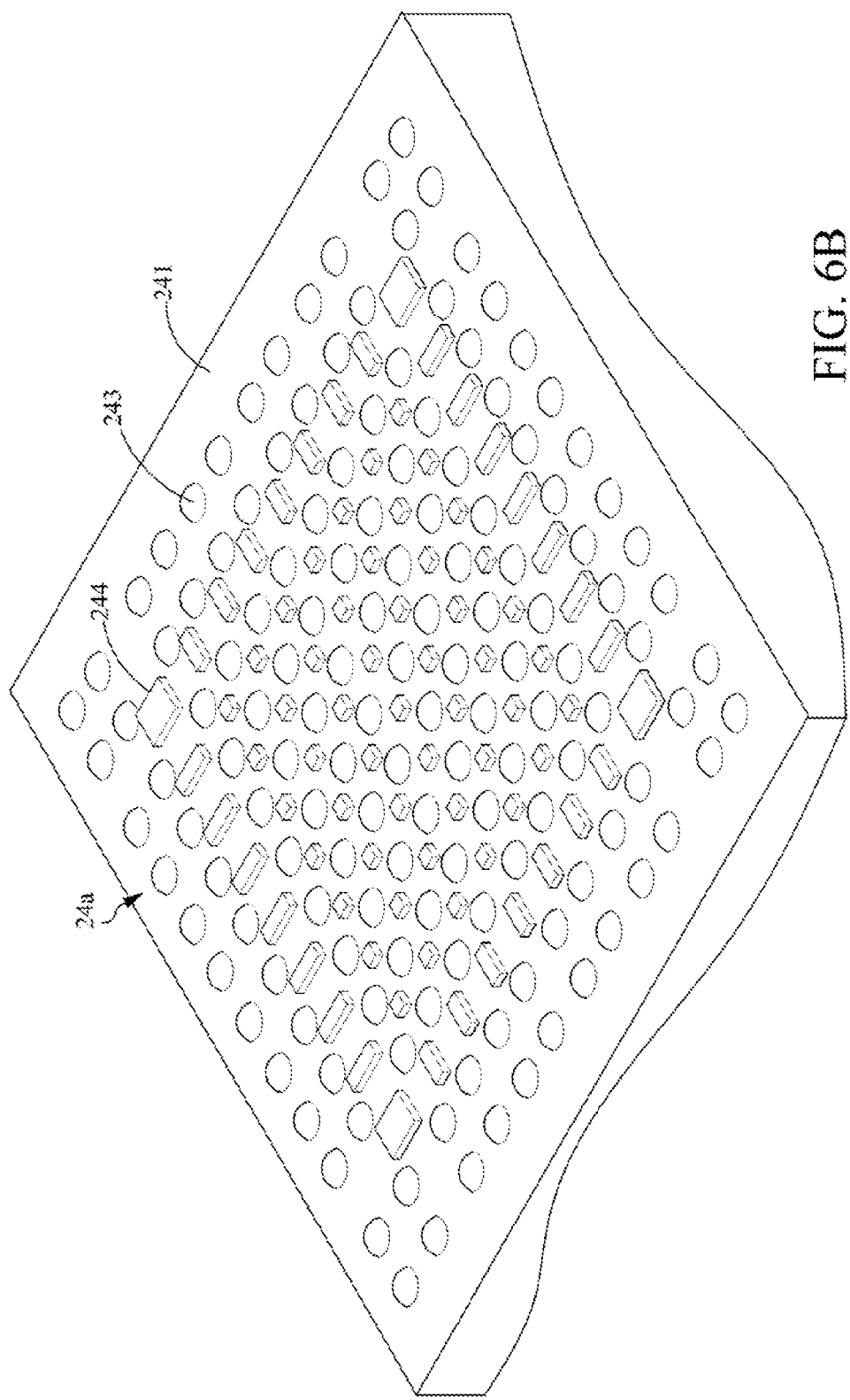
Figure 6C:
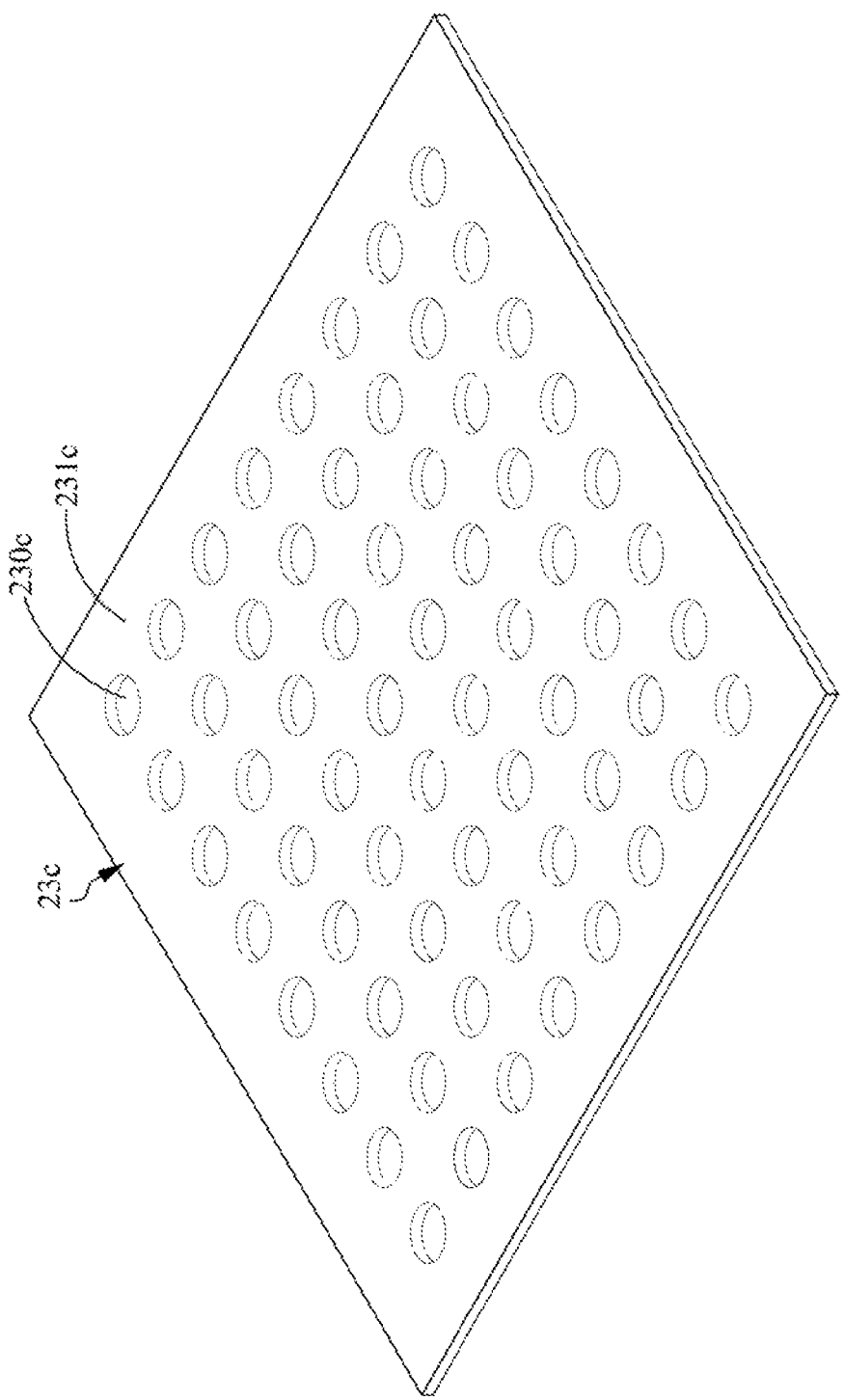
Figure 6D:
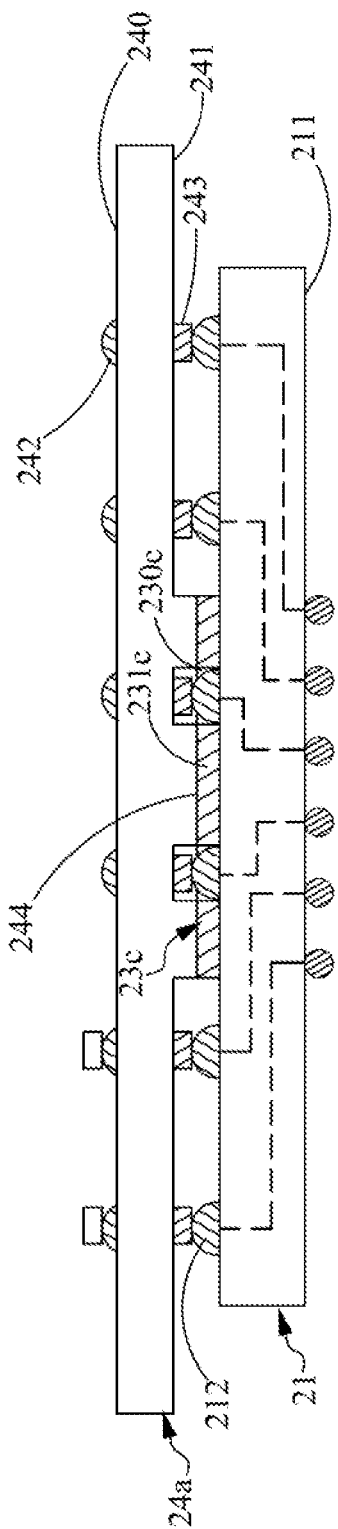

It is noted that in the embodiments shown in FIG. 5A and FIG. 5B, the reinforcement structure 23 and the strengthening plate 24 are two independent components, but in the embodiment shown in FIG. 6A, the strengthening plate 24 is integrally formed with the reinforcement structure 23, while allowing each via hole 230 to have at least one fifth conductive element fitted therein, and the projections 231 are arranged abutting against the surface of the converting plate where the first conductive elements 212 are disposed. In FIG. 6A, the integrally formed structure of the reinforcement structure 23 and the strengthening plate 24 is a multi-layered ceramic (MLC) structure. In addition, in another embodiment shown in FIG. 6B and FIG. 6C, the reinforcement structure 23C is a planar panel 231c having a plurality of via holes 230c boring through the same, whereas the strengthening plate 24a is substantially the assembly of a plurality of projections 244 formed on a surface 241 of the planar panel 231c. Moreover, the plural fifth conductive elements 243 are distributed in spaces formed between any two neighboring projections 244. Therefore, when the strengthening plate 24a is connected to the converting plate 21 by a reflow soldering process, the reinforcement structure 23c is sandwiched between the strengthening plate 24a and the converting plate 21 while allowing the plural projections 244 to abut against the planar panel 231c of the reinforcement structure 23c so as to achieve a structure shown in FIG. 6D.

Figure 7A:
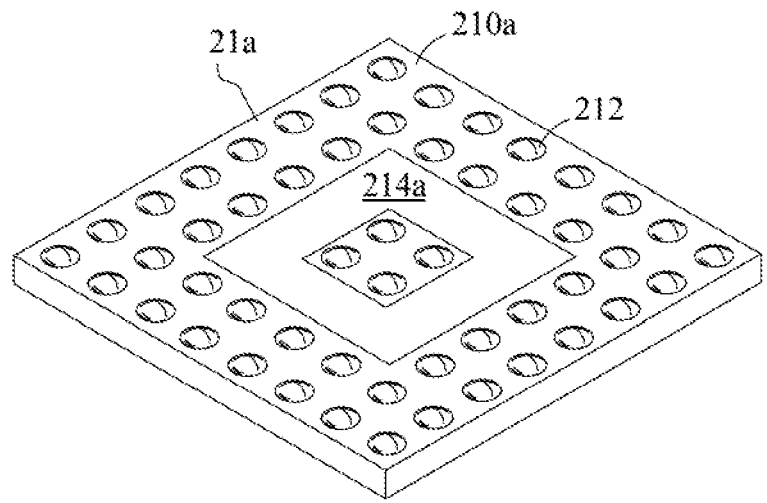
FIG. 7A is a schematic diagram showing a reinforcement structure according to an embodiment of the present invention.
Figure 7B:
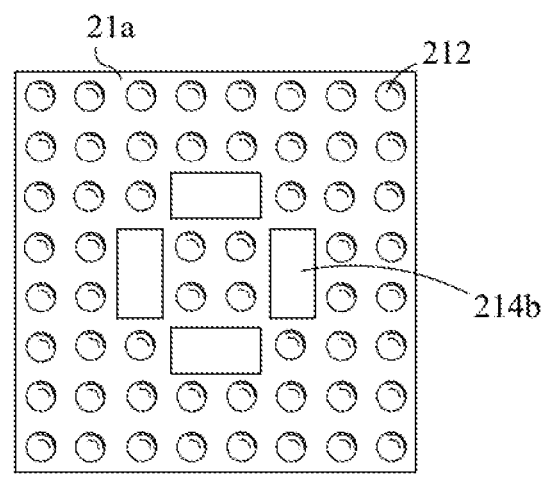
FIG. 7B and FIG. 7C are schematic diagrams showing two reinforcement areas of different shapes that are formed in the present invention.

Please refer to FIG. 7A, which is a schematic diagram showing a reinforcement structure according to an embodiment of the present invention. In FIG. 7A, there is a reinforcement area 214a defined in the first surface 210a of the converting plate 21a that is to be provided for the reinforcement structure to be disposed therein. Generally, converting plates 21a are often provided by manufacturers of semiconductor packaging, since the packaging substrate required in a semiconductor packaging process can generally be used and acted as the converting plate 21a. Thus, the converting plate is a substrate designed and produced for specific IC chip of the manufacturers of semiconductor packaging. In the embodiment shown in FIG. 7A, the reinforcement area 214a is a rectangle ring area. Please refer to IG. 7B and FIG. 7C, which are schematic diagrams showing two reinforcement areas of different shapes that are formed in the present invention. In FIG. 7B, the reinforcement area 214b is an assembly of a plurality of rectangle areas that are dispersedly distributed on the converting plate 21a, and in FIG. 7C, the reinforcement area 214c is a rectangle area arranged at the center of the converting plate 21a.

Figure 7C:
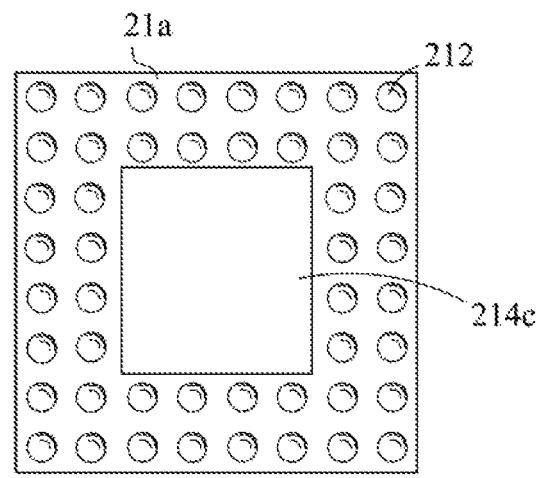
Figure 8A:
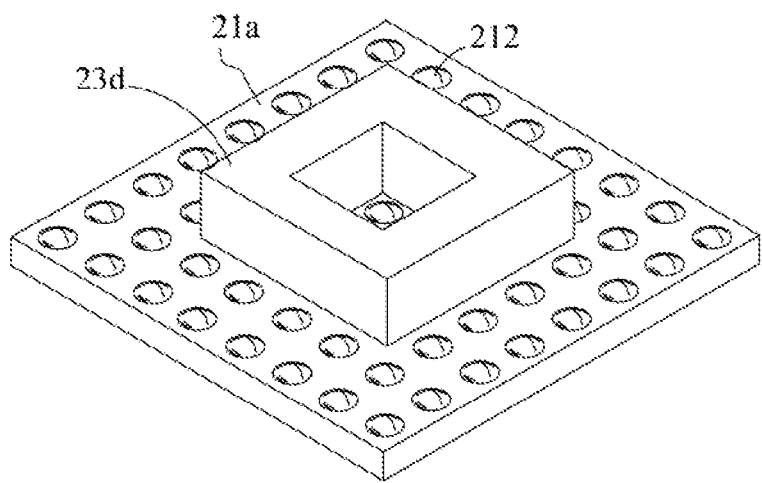
FIG. 8A is a schematic diagram showing a reinforcement structure formed inside the reinforcement area of FIG. 7A according to an embodiment of the invention.
Figure 8B:
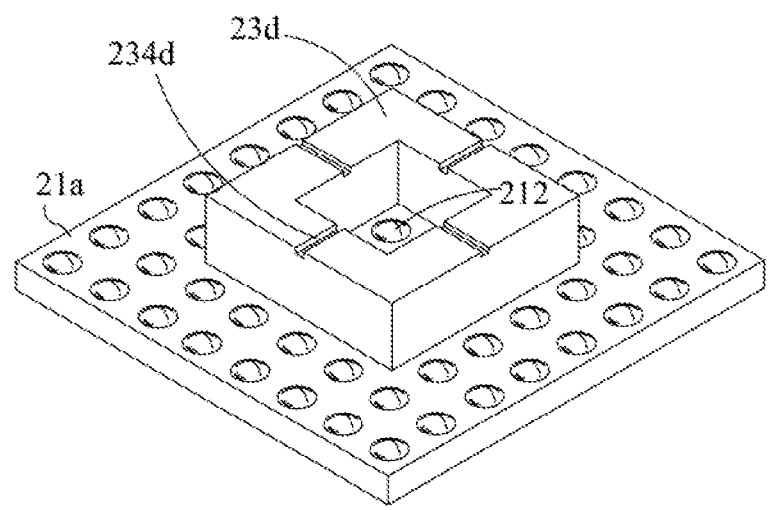
FIG. 8B is a schematic diagram showing a reinforcement structure formed inside the reinforcement area of FIG. 7A according to another embodiment of the invention.
Figure 8C:
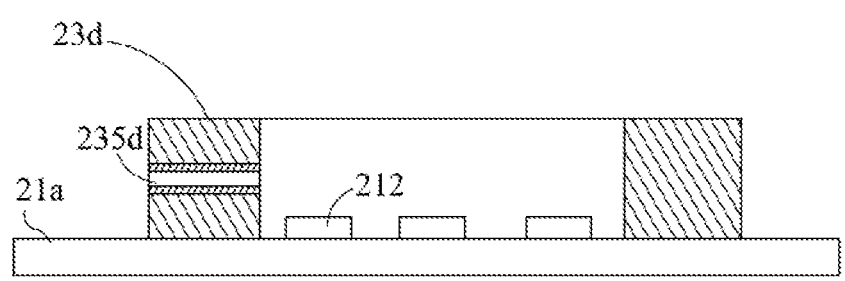
FIG. 8C is a schematic diagram showing components formed in the reinforcement structure of the invention for exhausting waste gases.

In an embodiment, the reinforcement structure formed inside the reinforcement area shown in FIG. 7A to FIG. 7C can be made of a polymer gel, such as epoxy resin. Please refer to FIG. 8A, which is a schematic diagram showing a reinforcement structure formed inside the reinforcement area of FIG. 7A according to an embodiment of the invention. In the embodiment shown in FIG. 8A, as the reinforcement area is formed in a rectangle ring shape and is coated by a layer of epoxy resin with a specific thickness, a block of hardened epoxy resin can be achieved after baking and used as the reinforcement structure 23d. It is noted that the thickness of the reinforcement structure 23d is determined according to the designed gap between the converting plate 21 and the substrate without other restrictions. Please refer to FIG. 8B, which is a schematic diagram showing a reinforcement structure formed inside the reinforcement area of FIG. 7A according to another embodiment of the invention. As shown in FIG. 8B, there are grooves 234d formed in the reinforcement structure 23d that are used for exhausting waste gases generated in a reflow soldering process. Nevertheless, there can be other way provided for gas exhausting that is not limited by the means disclosed in FIG. 8B, whereas one such example is shown in FIG. 8C. In FIG. 8C, since the reinforcement structure is formed with a specific thickness, it is achievable to bore and form a number 23d of exhausting tubes 235d inside the reinforcement structure for exhausting waste gases generating from the reflow soldering process.

Figure 9A:
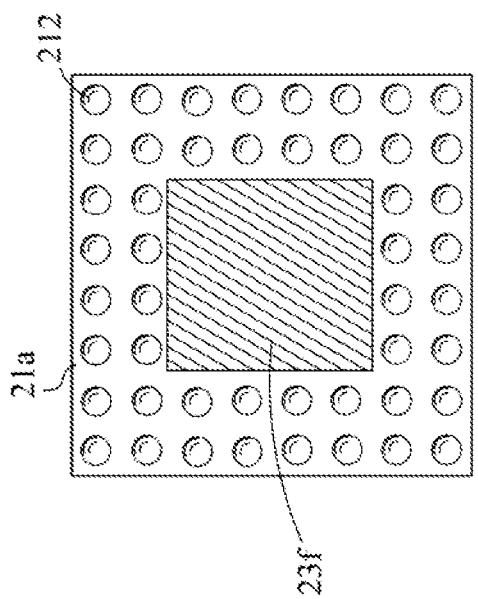
FIG. 9A is a schematic diagram showing a reinforcement structure formed inside the reinforcement area of FIG. 7B according to an embodiment of the invention.
Figure 9B:
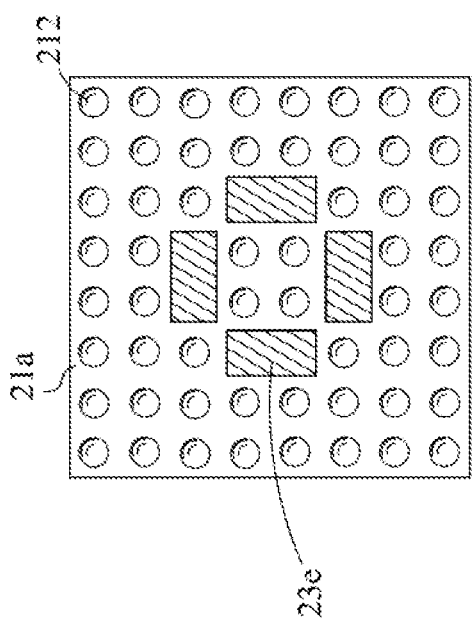
FIG. 9B to FIG. 9D are schematic diagrams showing different reinforcement structures formed inside the reinforcement area of FIG. 7C according to other embodiments of the invention.
Figure 9D:
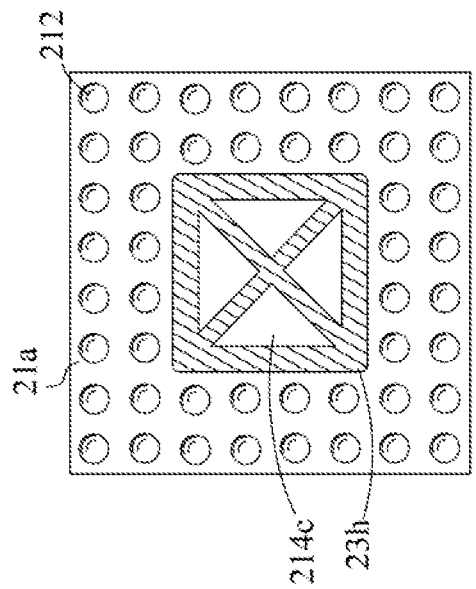
Figure 9C:
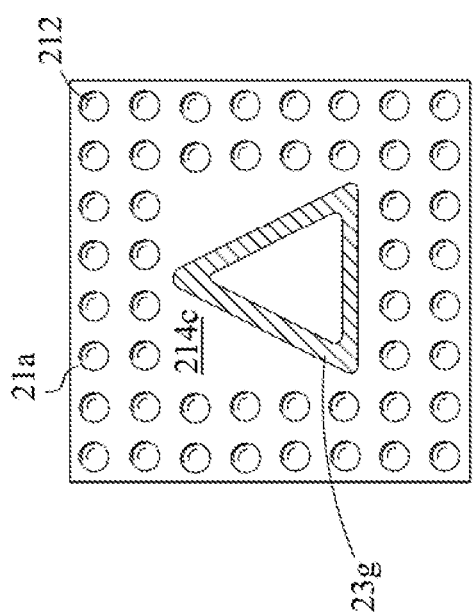

Please refer to FIG. 9A, which is a schematic diagram showing a reinforcement structure formed inside the reinforcement area of FIG. 7B according to an embodiment of the invention. In the embodiment shown in FIG. 9A, there are four reinforcement areas where each is being coated by a layer of epoxy resin so as to become a block of reinforcement structure 23e with a specific thickness after hardened. Please refer to FIG. 9B to FIG. 9D, which are schematic diagrams showing different reinforcement structures formed inside the reinforcement area of FIG. 7C according to other embodiments of the invention. In FIG. 9B, the reinforcement structure 23f is one big rectangle block of hardened epoxy resin that is located at the center of the converting plate 21a. In FIG. 9C, the reinforcement structure is a triangle ring-like block of epoxy resin that is located at the center of the rectangle reinforcement area 214, but is not limited to be the triangle ring-like block that it can be a rectangle ring-like block or a circular ring block, and so on. Moreover, the reinforcement structure can be an assembly of a plurality of ring-like structures. For instance, in FIG. 9D, the reinforcement structure is an assembly of a plurality of triangle ring-like blocks sharing a same top point that are arranged for locating their shared top point at the center of the reinforcement area 214c. However, the shape of the ring-like block of reinforcement structure is not limited by those disclosed in the foregoing embodiments, and thus can be formed into any shape as required.

Figure 10A:
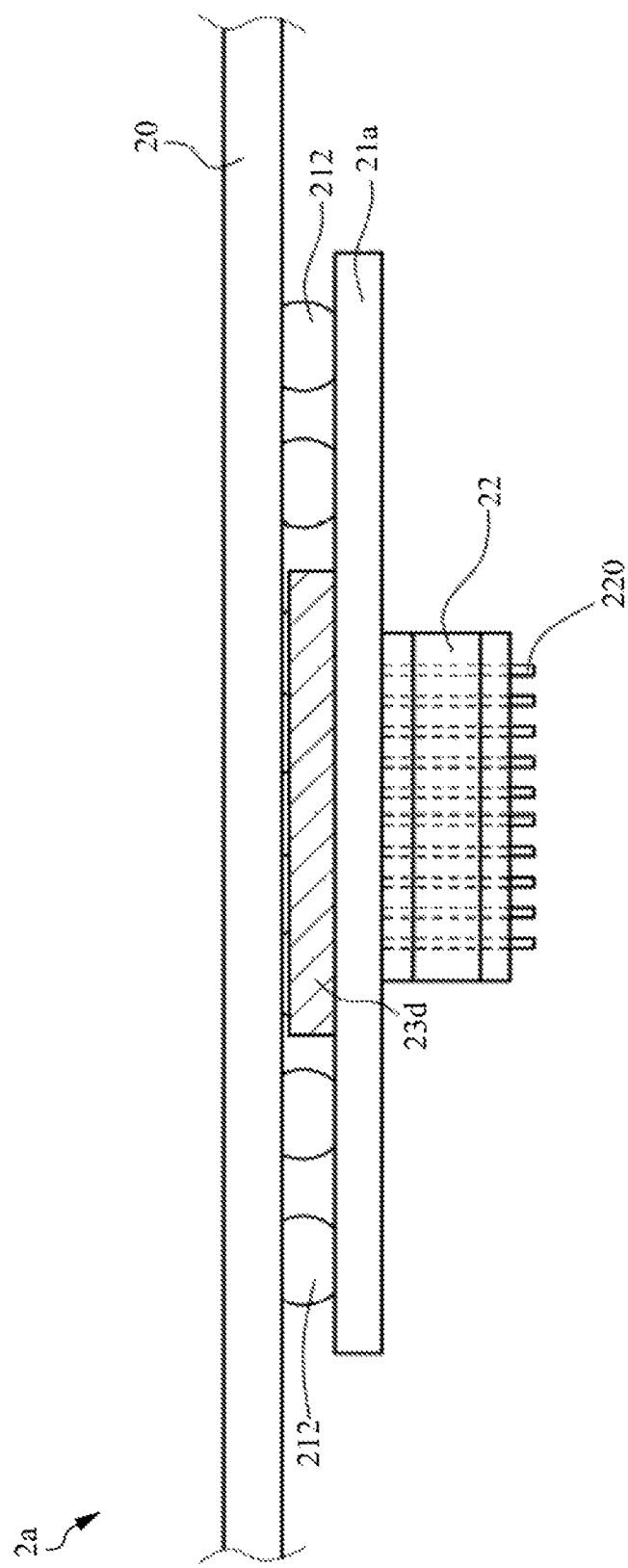
FIG. 10A is a schematic diagram showing an apparatus for probing die electricity according to a fifth embodiment of the invention.
Figure 10B:
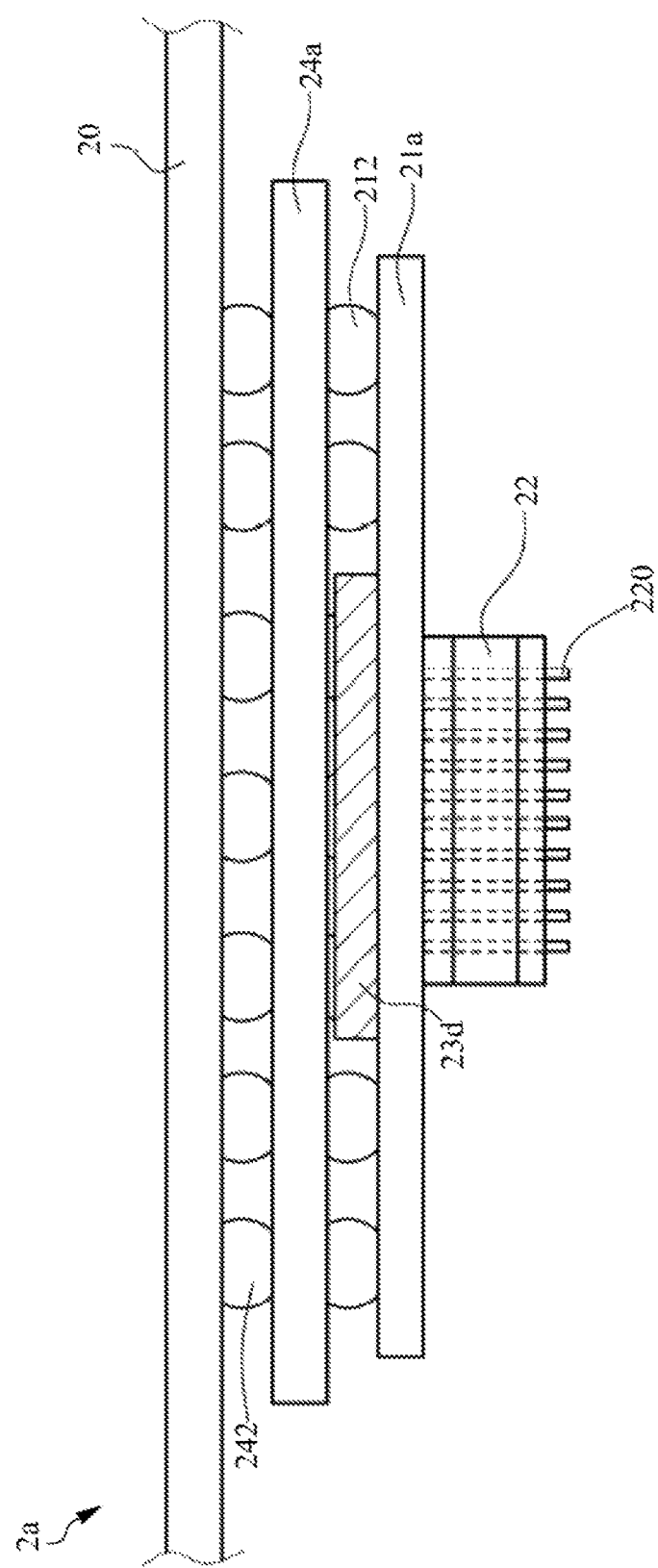
FIG. 10B is a schematic diagram showing an apparatus for probing die electricity according to a sixth embodiment of the invention.

Please refer to FIG. 10A, which is a schematic diagram showing an apparatus for probing die electricity according to a fifth embodiment of the invention. In this embodiment, the converting plate 21a of the probing apparatus 2a is coupled to the needle module 22 of the probing apparatus 2a while allowing the first conductive elements 212 on the converting plate 21a to connect electrically to the substrate 20. Moreover, the converting plate 21a used in this embodiment can be the converting plate shown in FIG. 7A to FIG. 7C, and the reinforcement structure 23d formed on the converting plate 21a can be any one of the reinforcement structures shown in FIG. 8A to FIG. 9D. It is noted that the reinforcement structure 23d can be arranged in contact with the substrate 20 or spacing from the substrate 20 by a distance. In this embodiment, the reinforcement structure 23d is arranged spacing from the substrate 20 by a distance. Please refer to FIG. 10B, which is a schematic diagram showing an apparatus for probing die electricity according to a sixth embodiment of the invention. In the sixth embodiment, the probing apparatus is formed basically the same as the one shown in FIG. 10A, but is different in that: there is an additional strengthening plate 24a arranged at a position between the converting plate 21a and the substrate 20 that is connected respectively and electrically to the converting plate 21a and the substrate 20. Moreover, in this embodiment, the reinforcement structure 23d is arranged spacing from the strengthening plate 24a by a distance, and the strengthening plate 24a is adhered to the substrate 20 by a plurality of solder bumps or solder balls, which is also true for the adhering of the strengthening plate 24a to the converting plate 21a.

Figure 10C:
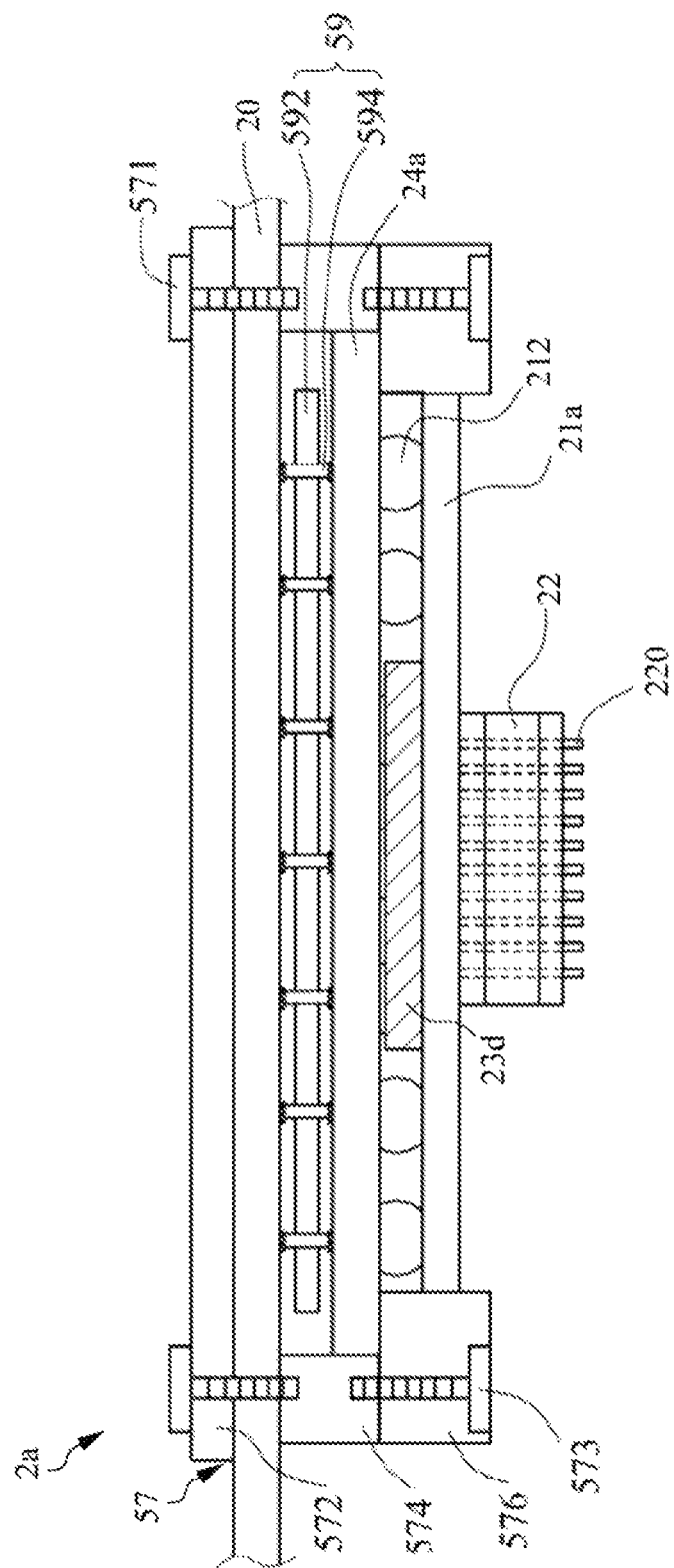
FIG. 10C is a schematic diagram showing an apparatus for probing die electricity according to a seventh embodiment of the invention.

Please refer to FIG. 10C, which is a schematic diagram showing an apparatus for probing die electricity according to a seventh embodiment of the invention. In the seventh embodiment, the probing apparatus is formed basically the same as the one shown in FIG. 10B, but is different in that: the electrical connection between the strengthening plate 24a and the substrate 20 is achieved through an additional elastic conductive element 59, by that a good electrical connection between the strengthening plate 24a and the substrate 20 can be ensured. In this embodiment, the elastic conductive element 59 includes a support panel 592 and a plurality of conductors 594, and each of the plural conductors 594 is arranged penetrating the support panel 592 for allowing two opposite ends of the conductor 594 to connect electrically and respectively to the electrical pads on the strengthening plate 24a and the substrate 20. In this embodiment, each of the plural conductors 594 is an element with elasticity. Moreover, for maintaining good electrical connection between each conductor 594 to the strengthening plate 24a and the substrate 20, the probing apparatus 2a further comprises a fixing element 27, which is used for adjusting the electrical connection between each conductor 594 to the strengthening plate 24a and the substrate 20. As shown in FIG. 10C, the fixing element 57 is configured with a stiffness 572, a frame 574 and a clip 76 in a manner that the stiffness 572 is fixed secured to a surface of the substrate 20 by a plurality of first locking units 571, the frame 574 is fixed secured to another surface of the substrate 20 by the plural first locking unit 571, and the clip 576 is fixed secured to the frame by a second locking unit 573 so as to be clamped upon the strengthening plate 24a. In this embodiment, the frame 574 is arranged abutting against a side of the strengthening plate 24a, while the clip 576 is arranged engaging to the bottom of the strengthening plate 24a. Accordingly, the flatness of the substrate 20 in a horizontal level can be adjusted using the plural first locking units 571, and simultaneously by the clamping of the clip 576 upon the strengthening plate 24a, a pressure can be exerted upon the elastic conductors 594 that can work cooperatively the first locking units 571 for ensuring a good electrical connection to be achieved between the substrate 20 and the strengthening plate 24a through the elastic conductive element 59.

Figure 11A:
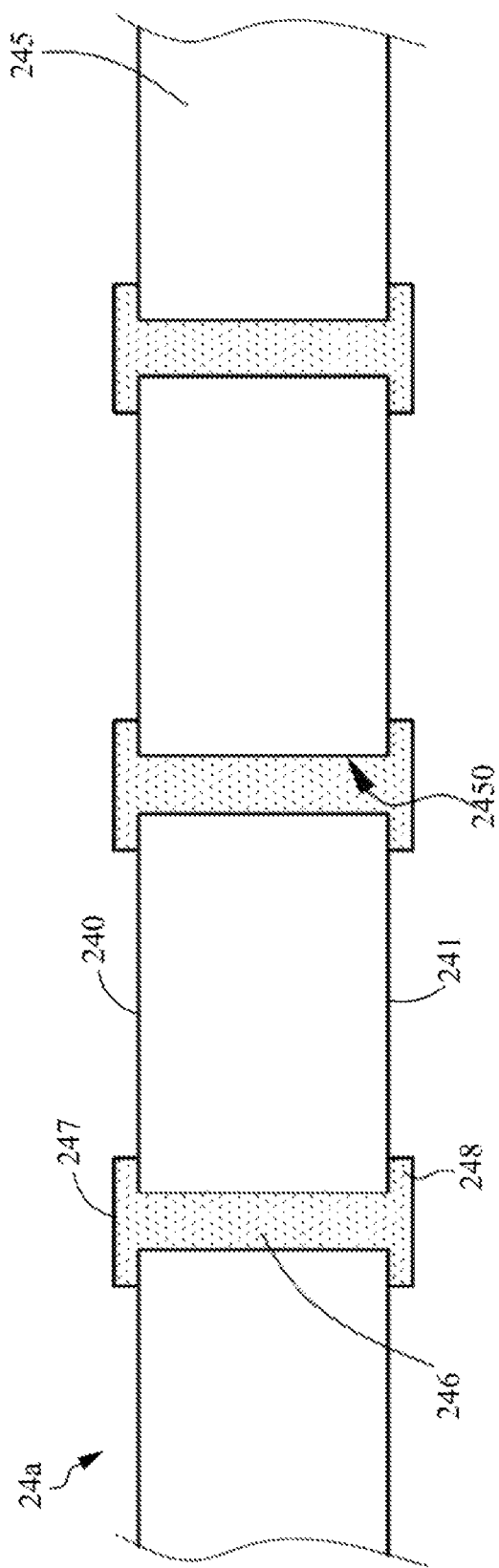
FIG. 11A to FIG. 11C are cross sectional views of various strength plates according to different embodiments of the invention.
Figure 11B:
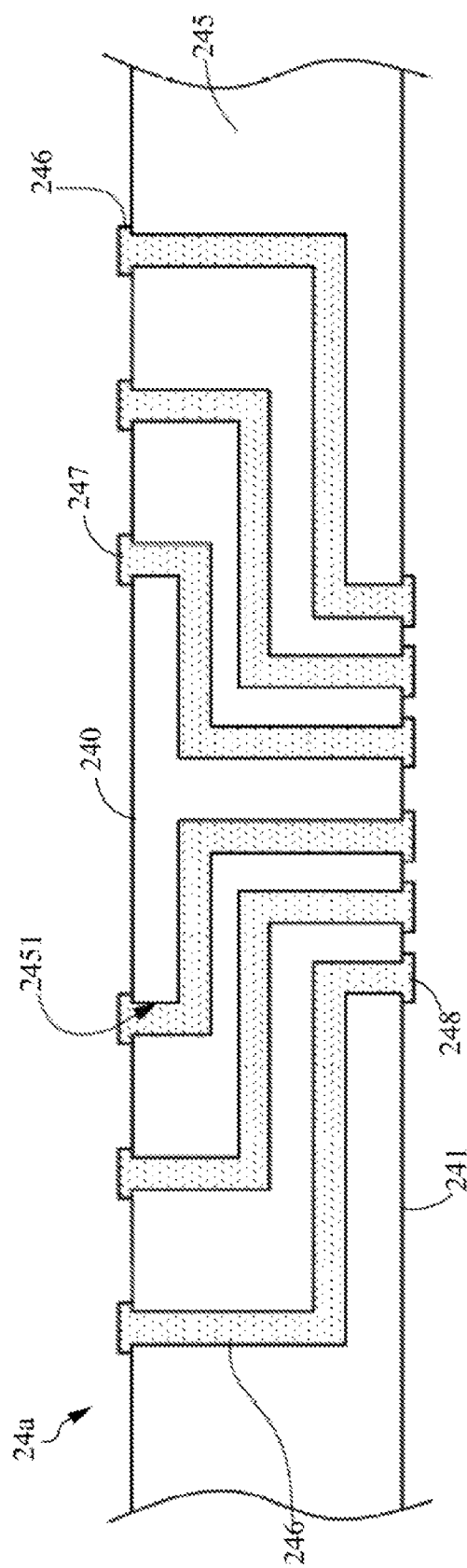
Figure 11C:
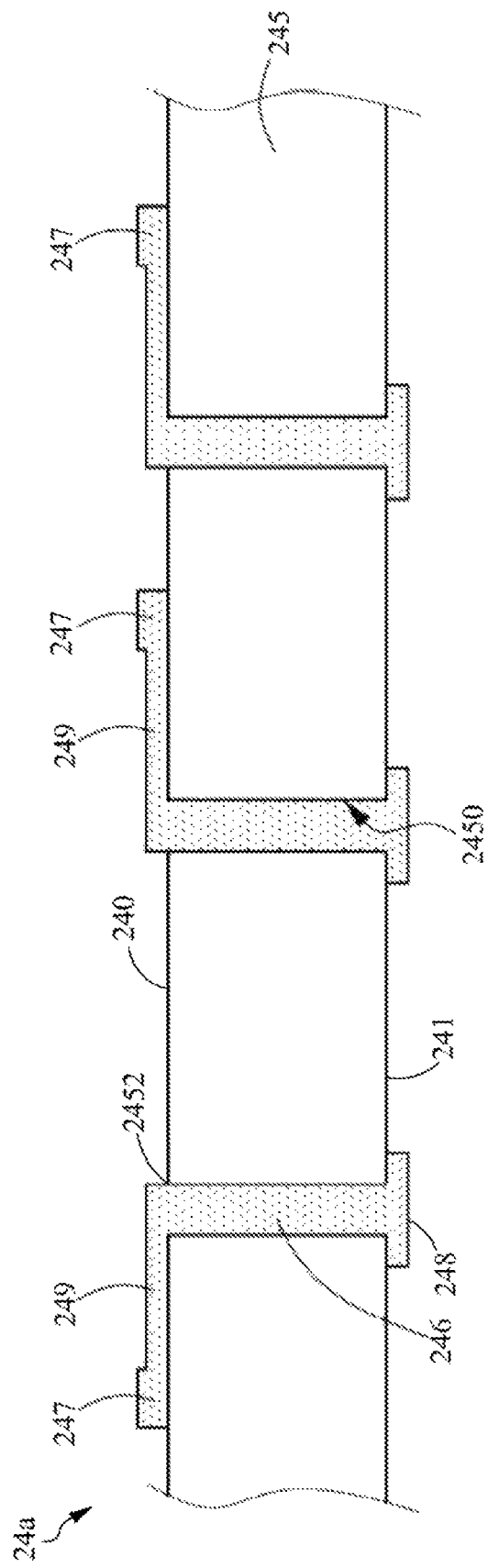

Please refer to FIG. 11A to FIG. 11C, which are cross sectional views of various strength plates according to different embodiments of the invention. As shown in FIG. 11A, the strengthening plate 24a is composed of a panel 245 and a plurality of conductive lines 246, and each of the conductive lines is arranged passing through the panel 245 respectively via their corresponding channels 2450, by that there are two electrical pads 247 and 248 for each conductive line 246 to be formed respectively on a top surface 240 and a bottom surface 241 of the panel 245. In this embodiment, all the electrical pads 248 on the bottom surface 241 of the panel 245 are spaced from one another by a pitch equal to that between any two of the electrical pads 247 on the top surface 240 of the panel 245. In addition, all the electrical pads 247 and 248 are connected electrically to the substrate 20 and the converting plate 21a shown in FIG. 5A, FIG. 5B and FIG. 10B. As shown in FIG. 11B, the strengthening plate 24a is formed basically the same as the one shown in FIG. 11A, but is different in that: each of the channels 2451 in FIG. 11B is formed with at least one turn so as to enable all the electrical pads 248 on the bottom surface 241 of the panel 245 are spaced from one another by a pitch that is larger than that between any two of the electrical pads 247 on the top surface 240 of the panel 245, and thus enabling the strengthening plate 24a to function like a converting plate with space transforming ability. In addition, as shown in FIG. 11C, the strengthening plate 24a is formed basically the same as the one shown in FIG. 11A, but is different in that: for each conductive line 246, it is connected to a corresponding extending line 249 at an opening 2452 on the top surface 240 after penetrating the panel 245 through the channel 2450 as the extending line 249 is disposed adhering and extending on the top surface 240, while allowing its corresponding electrical pad 247 to be formed at the free end of the extending line 249, and thereby, the spatial relationship between the electrical pads 247 on the top surface 240 and the electrical pads 248 on the bottom surface 241 is changed comparing with that of FIG. 11A so that the strengthening plate 24a is enabled to function like a converting plate with improved flexibility in space transforming. It is noted that the strengthening plate 24a shown in FIG. 11A to FIG. 11C can be adapted to fit in a space sandwiching between the substrate 20 and the converting plate 21a shown in FIG. 5A, FIG. 5B and FIG. 10B and to be used for structure integrality enhancement and space transformation.

Figure 12A:
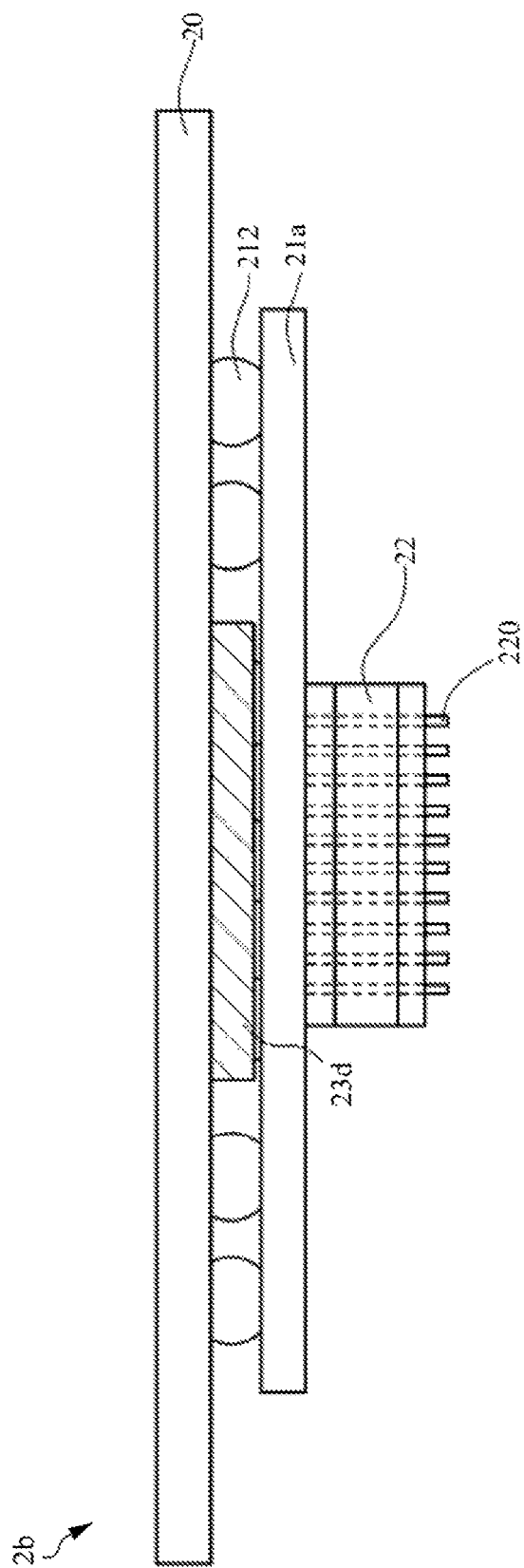
FIG. 12A and FIG. 12B are cross sectional views of various apparatuses for probing die electricity according to different embodiments of the invention.
Figure 12B:
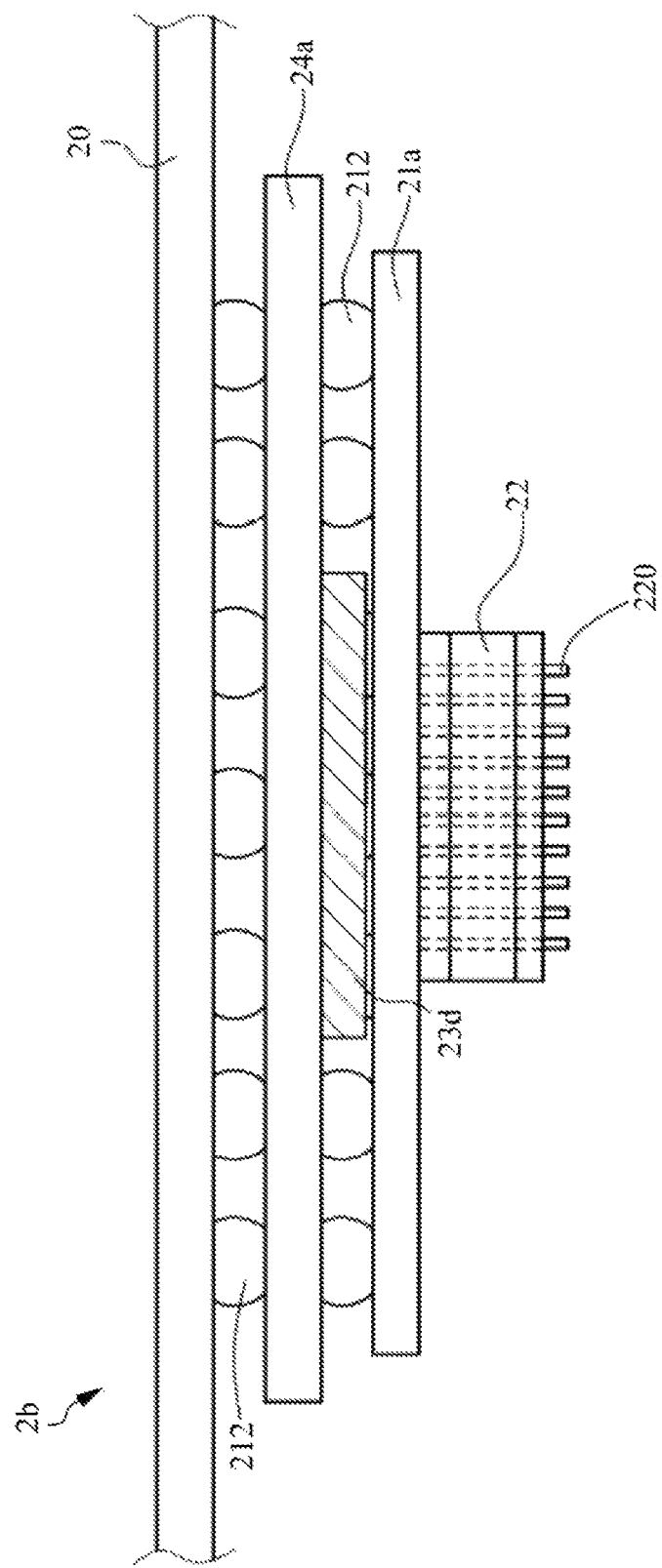

Please refer to FIG. 12A and FIG. 12B, which are cross sectional views of various apparatuses for probing die electricity according to different embodiments of the invention. It is noted that the probing apparatuses 2b shown in FIG. 12A and FIG. 12B are formed basically the same as those shown in FIG. 10A and FIG. 10B, but are different in the way how the reinforcement structure is constructed and arranged. In FIG. 12A, the reinforcement structure 23d is disposed on the substrate 20 and not on the converting plate 21a but is arranged within an area corresponding to the reinforcement area of the converting plate 21a while maintaining a gap to be formed therebetween. Nevertheless, the reinforcement structure 23d of FIG. 12A that is disposed on the substrate 20 can be arranged to engage directly to the reinforcement area of the converting plate 21a. In another embodiment shown in FIG. 12B, the reinforcement structure 23d is disposed on the strengthening plate 24a within an area corresponding to the reinforcement area of the converting plate 21a while maintaining a gap to be formed therebetween. Nevertheless, the reinforcement structure 23d of FIG. 12B that is disposed on the strengthening plate 24a can be arranged to engage directly to the reinforcement area of the converting plate 21a. It is noted that although the fixing element 57 and the elastic conductive element shown in the embodiment of FIG. 10C is applied to the probing apparatuses of the invention that is configured with the strengthening plate 24a, but they are not limited thereby and thus can be adapted for the probing apparatuses shown in FIG. 2A, FIG. 10A and FIG. 12A.

Figure 13:
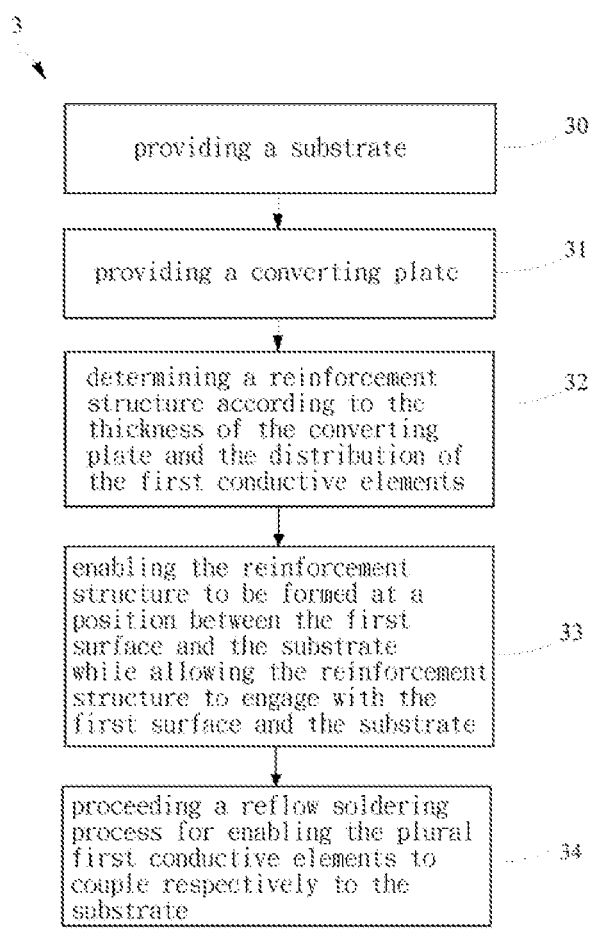
FIG. 13 is a flow chart showing the steps performed in a method for forming an apparatus for probing die electricity according to an embodiment of the invention.

Please refer to FIG. 13, which is a flow chart showing the steps performed in a method for forming an apparatus for probing die electricity according to an embodiment of the invention. It is noted that the method of FIG. 13 can be adapted for probing apparatuses shown in FIG. 2A, FIG. 2B, FIG. 5, FIG. 10A, FIG. 10B, FIG. 10C, FIG. 11 and FIG. 11B. For clarity, the following description is illustrated using the probing apparatus of FIG. 2A for example. As shown in FIG. 13, the probing method 3 starts from step 30. At step 30, first a substrate 20 which can substantially be a circuit board is provided, and then the flow proceeds to step 31. At step 31, a converting plate is provided, and then the flow proceeds to step 32. It is noted that the converting plates 21a are generally provided by manufacturers of semiconductor packaging, since the packaging substrate required in a semiconductor packaging process can generally be used and acted as the converting plate 21a. Thus, the converting plate is a substrate designed and produced for specific IC chip of the manufacturers of semiconductor packaging, but it is not limited thereby. In an embodiment of the invention, the converting plate 21 is made in a thickness smaller than 1 mm.

At step 32, the specification of a reinforcement structure 23, such as the thickness and size of the reinforcement structure 23, is determined according to the thickness of the convening plate 21 and the distribution of the first conductive elements 212 on the converting plate 21, and then the flow proceeds to step 33. It is noted that the plural first conductive elements 212 are distributed on the converting plate 21 in a manner according to actual requirement, and consequently, based upon the distribution, each via hole 230 of the reinforcement structure 23 should be arranged at a corresponding position and larger enough to allow at least one of the plural first conductive elements 212 to fit therein. In addition, in an embodiment of the invention, there are a plurality of projections 231 formed on the panel 231 of the reinforcement structure 23 that are arranged into a two-dimensional array.

At step 33, the reinforcement structure 23 is enabled to be formed between the first surface 210 and the substrate 20 at a position corresponding to at least one of the plural second conductive elements 213; and then the flow proceeds to step 34. In view of the embodiments shown in FIG. 2A and FIG. 5, the forming of the reinforcement structure comprises the following steps: providing a panel and then using a first machining means to formed a plurality of via holes in the panel, whereas the first machining means can be a drilling means enabled using either a drill bit or a milling cutter; using a second machining means to form a plurality of exhaust passages in the panel, whereas the second machining means can be a milling means. Please refer to FIG. 14, which is a schematic diagram showing a plurality of exhaust passages formed in the apparatus of the invention. As shown in FIG. 14, by the machining of the panel using a milling cutter 5, there are a plurality of via holes 230 formed in the panel. Thereafter, the milling cutter 5 is raised by a specific height, and used to mill and remove a layer of excess material from the panel in a one-dimensional or two-dimensional machining manner so as to reduced the depths of the plural via holes and then achieving a reinforcement structure 23 formed with a plurality of projections and exhaust passages that are arranged surrounding the plural via holes, as those shown in FIG. 3 to FIG. 4C.

Moreover, the reinforcement structure 23 is arranged sandwiching between and abutting against the first surface 210 of the converting plate 21 and the substrate 20 while allowing each via hole 230 to receive at least one of the plural first conductive elements 212, and also the panel 231 of the reinforcement structure 23 is arranged at a position corresponding to at least one of the plural second conductive elements 213 while allowing the plural projections 232 to abut against the substrate 20 so as to construct a plurality of exhaust passages accordingly. Thereafter, the flow proceeds to step 34. At step 34, a reflow soldering process is performed for enabling the plural first conductive elements 212 to couple respectively to the substrate 20. During the reflow soldering of step 34, waste gases generated from the reflow soldering can be exhausted by the exhaust passages. After completing the step 34, by coupling the assembly of the converting plate 21, the reinforcement structure 23 and the substrate 20 to the needle module 22, a probing apparatus of the invention can be achieved.

In view of the embodiments shown in FIG. 10A to FIG. 10C, and FIG. 11A to FIG. 11B, the reinforcement structure that is to be formed in the step 13 of FIG. 13 can be achieved by the coating of a thick layer of epoxy resin. In an embodiment of the invention, the reinforcement area is first being defined and then provided to be coated by a layer of epoxy resin with a specific thickness, whereas the specific thickness can be determined according to the thickness of the converting plate. In a condition where there is no strengthening plate being used in a probing apparatus of the invention, a block of hardened epoxy resin that is coated directly in to the reinforcement area can be achieved after baking so as to be used as the reinforcement structure. It is noted that the reinforcement structure can be arranged abutting against the substrate directly or maintaining a gap between itself and the substrate. In another embodiment, the layer of epoxy resin can be coated on the substrate in an area corresponding to the reinforcement area of the converting plate. On the other hand, in a condition where there is a strengthening plate used in a probing apparatus of the invention, similarly either the layer of epoxy resin can be coated directly in the reinforcement area of the converting plate or the layer of epoxy resin can be coated on the strengthening plate in an area corresponding to the reinforcement area of the converting plate.

By the reinforcement structure or the assembly of the reinforcement structure and the strengthening plate, the reaction force resulting of the probing of the needles to an IC chip when the probing apparatus is used in a die electricity test can be dispersed and supported by the reinforcement structure and the strengthening plate as the panel of the reinforcement structure is engaged to at least one of the plural second conductive elements, so that the pressure exerted on the converting plate in an area corresponding to the needles can be reduced, and thereby, for those thin converting plate formed with a thickness smaller than 1 mm, the risk of deformation and cracking is decreased.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. An apparatus for probing die electricity, comprising:
    a substrate;
    a converting plate having a first surface, a second surface opposite to the first surface, a plurality of first conductive elements disposed on the first surface and arranged coupling respectively to and contacting directly with the substrate, at least one reinforcement area defined in the first surface among the plurality of first conductive elements, and a plurality of second conductive elements disposed on the second surface, a first pitch between two neighboring second conductive elements being smaller than a second pitch between two neighboring first conductive elements; and
    a reinforcement structure made from an electrically insulating polymer gel and disposed at the at least one reinforcement area and between the converting plate and the substrate.

2. The apparatus of claim 1, further comprising a needle module that is configured with a plurality of needles respectively and electrically connected to the plural second conductive elements.

3. The apparatus of claim 1, wherein the reinforcement structure formed inside the at least one reinforcement area is a structure selected from the group consisting of a solid structure, a ring structure and an assembly of a plurality of ring structures.

4. The apparatus of claim 3, wherein there are a plurality of grooves formed on a surface of the ring structure corresponding to the substrate.

5. The apparatus of claim 1, wherein there is a gap formed between a surface of the reinforcement structure in the at least one reinforcement area and the substrate; the surface of the reinforcement structure corresponds to the substrate.

6. The apparatus of claim 1, wherein the substrate is substantially a circuit board that has a plurality of third conductive elements arranged thereon and respectively connecting to the plural first conductive elements.

7. The apparatus of claim 1, wherein the substrate further comprises:
a circuit board, having a plurality of third conductive elements disposed thereon;
a strengthening plate, arranged at a position between the reinforcement structure and the circuit board, having a plurality of fourth conductive elements and a plurality of fifth conductive elements that the plural fourth conductive elements are disposed on one surface of the strengthening plate, and the plural fifth conductive elements are disposed on another surface opposite to the one for the fourth conductive elements, while allowing the plural fourth conductive elements to be connected electrically and respectively to the plural third conductive elements, and the plural fifth conductive elements to be connected electrically and respectively to the plural first conductive elements.

8. The apparatus of claim 1, wherein each of the plural second conductive elements is a bump, a ball or a pad.

9. The apparatus of claim 1, wherein each of the plural first conductive elements is a bump, a ball or a pad made of tin solder.

10. An apparatus for probing die electricity, comprising:
a substrate;
a converting plate having a first surface, a second surface opposite to the first surface, a plurality of first conductive elements disposed on the first surface and arranged coupling respectively to the substrate, and a plurality of second conductive elements disposed on the second surface, a first pitch between two neighboring second conductive elements being smaller than a second pitch between two neighboring first conductive elements; and
a reinforcement structure, disposed between the converting plate and the substrate in a way that a surface of the reinforcement structure faces the substrate, the plural first conductive elements protrude over the surface of the reinforcement structure, and a gap exists between the surface of the reinforcement structure and the substrate.

11. The apparatus of claim 10, further comprising a needle module that is configured with a plurality of needles respectively and electrically connected to the plural second conductive elements.

12. The apparatus of claim 10, wherein the reinforcement structure is made from a polymer gel.

13. The apparatus of claim 10, wherein each of the plural second conductive elements is a bump, a ball or a pad.

14. The apparatus of claim 10, wherein the reinforcement structure covers partially the plural first conductive elements.

15. The apparatus of claim 10, wherein the substrate is substantially a circuit board that has a plurality of third conductive elements arranged thereon and respectively connecting to the plural first conductive elements.

16. The apparatus of claim 10, wherein the substrate further comprises:
a circuit board, having a plurality of third conductive elements disposed thereon;
a strengthening plate, arranged at a position between the reinforcement structure and the circuit board, having a plurality of fourth conductive elements and a plurality of fifth conductive elements that the plural fourth conductive elements are disposed on one surface of the strengthening plate, and the plural fifth conductive elements are disposed on another surface opposite to the one for the fourth conductive elements, while allowing the plural fourth conductive elements to be connected electrically and respectively to the plural third conductive elements, and the plural fifth conductive elements to be connected electrically and respectively to the plural first conductive elements.

17. The apparatus of claim 10, wherein the reinforcement structure has a plurality of via holes and at least one of the first conductive elements is received in each of the via holes.

* * * * *